(12) United States Patent
Furuya

(10) Patent No.: US 8,642,472 B2
(45) Date of Patent: *Feb. 4, 2014

(54) METHOD FOR MANUFACTURING A SEMICONDUCTOR DEVICE

(75) Inventor: Akira Furuya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/495,586

(22) Filed: Jun. 13, 2012

(65) Prior Publication Data

US 2012/0264288 A1 Oct. 18, 2012

Related U.S. Application Data

(62) Division of application No. 12/898,165, filed on Oct. 5, 2010, now Pat. No. 8,222,142.

(30) Foreign Application Priority Data

Oct. 5, 2009 (JP) ................................. 2009-231131

(51) Int. Cl.
*H01L 21/44* (2006.01)
(52) U.S. Cl.
USPC .................................. 438/687; 257/E21.579
(58) Field of Classification Search
USPC .................... 438/677; 257/E21.479, E21.586
See application file for complete search history.

(56) References Cited

U.S. PATENT DOCUMENTS

| 6,429,118 | B1 | 8/2002 | Chen et al. | |
|---|---|---|---|---|
| 6,841,466 | B1 | 1/2005 | Yu et al. | |
| 6,903,016 | B2 | 6/2005 | Cohen | |
| 2006/0234499 | A1 | 10/2006 | Kodera et al. | |
| 2007/0173056 | A1* | 7/2007 | Kodera | ......................... 438/633 |

FOREIGN PATENT DOCUMENTS

| JP | 2001-144181 | 5/2001 |
|---|---|---|
| JP | 2002-020891 | 1/2002 |
| JP | 2002-118109 | 4/2002 |
| JP | 2004-214508 | 7/2004 |
| JP | 2005-333153 | 12/2005 |
| JP | 2007-149824 | 6/2007 |

OTHER PUBLICATIONS

Reid et al., "Electrofill Challenges and Directions for Future Device Generations", Advanced Metallization Conference 2007 17/Asia Session.
Chinese Official Action—201010508390.5—Aug. 14, 2013.

* cited by examiner

*Primary Examiner* — Chandra Chaudhari
(74) *Attorney, Agent, or Firm* — Young & Thompson

(57) ABSTRACT

A generation of a void in a recessed section is inhibited. A method for manufacturing a semiconductor device includes: an operation of forming recessed sections in an insulating film, which is formed on a semiconductor substrate; an operation of forming a seed film in the recessed section; an operation of forming a cover metal film in the recessed section; an operation of selectively removing the cover metal film to expose the seed film over the bottom section of the recessed section; and an operation to carrying out a growth of a plated film to fill the recessed section by utilizing the seed film exposed in the bottom section of the recessed section as a seed.

12 Claims, 23 Drawing Sheets

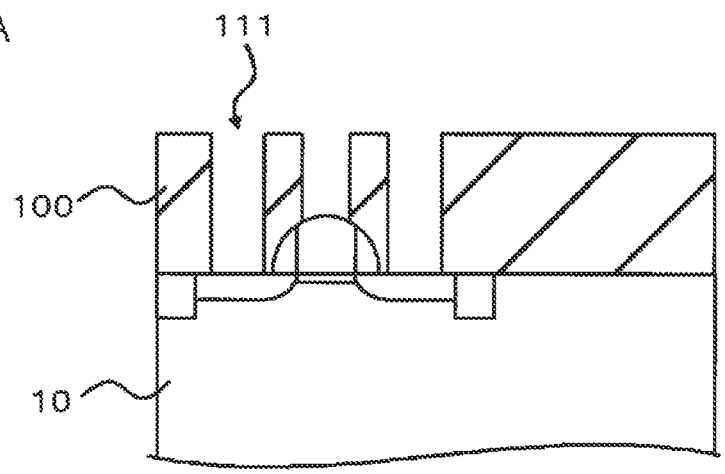
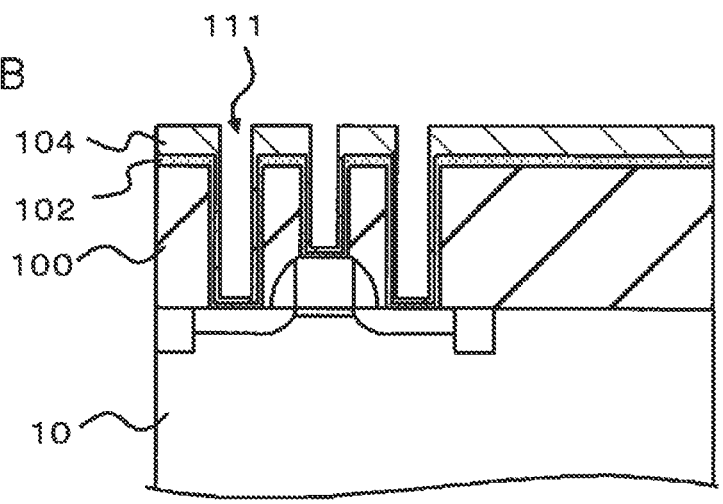
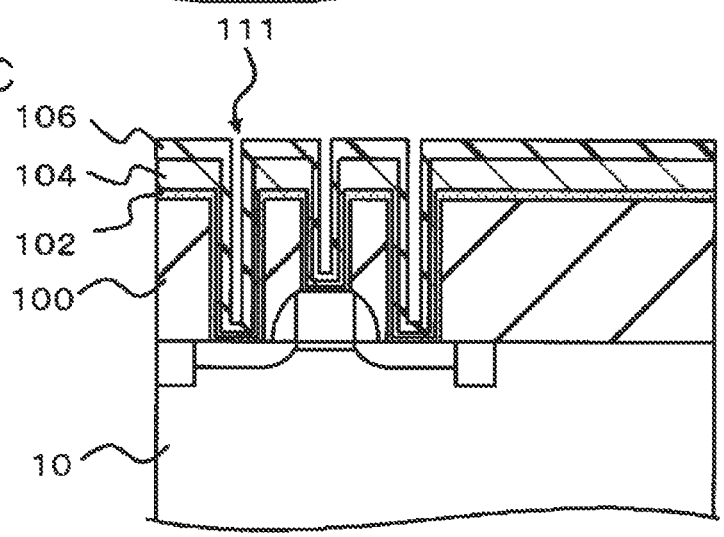

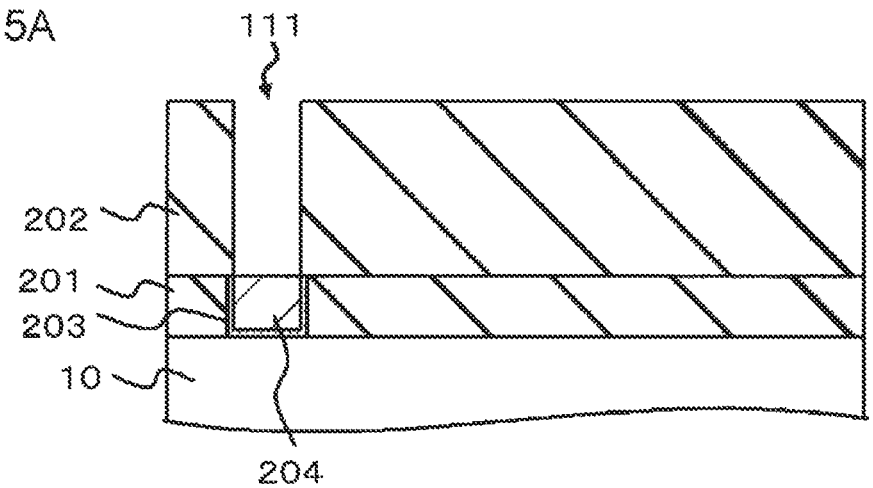
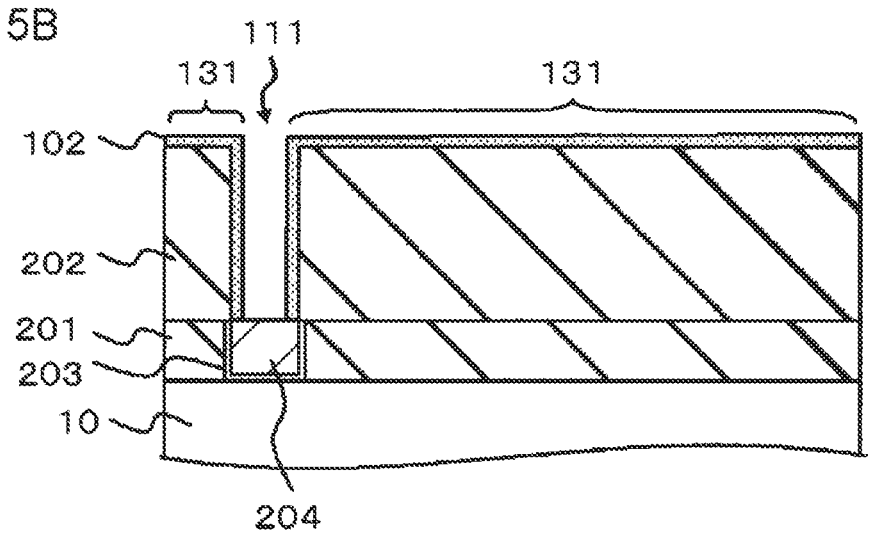
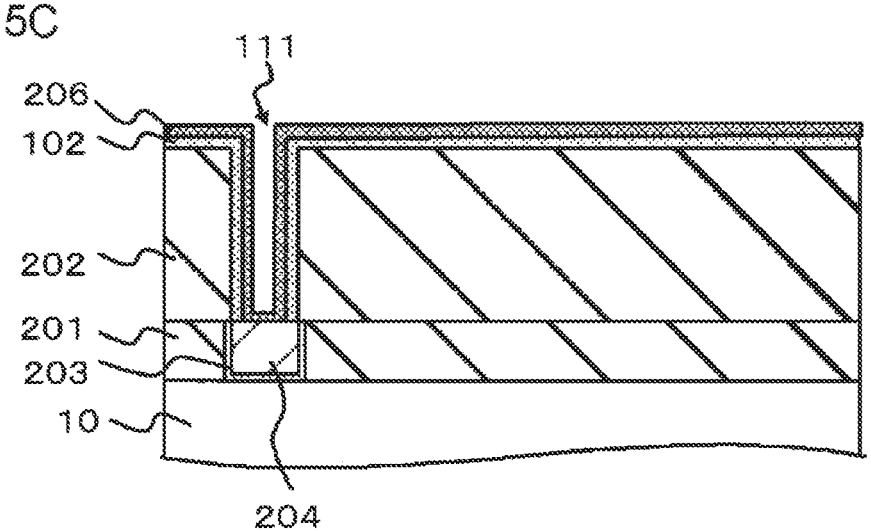

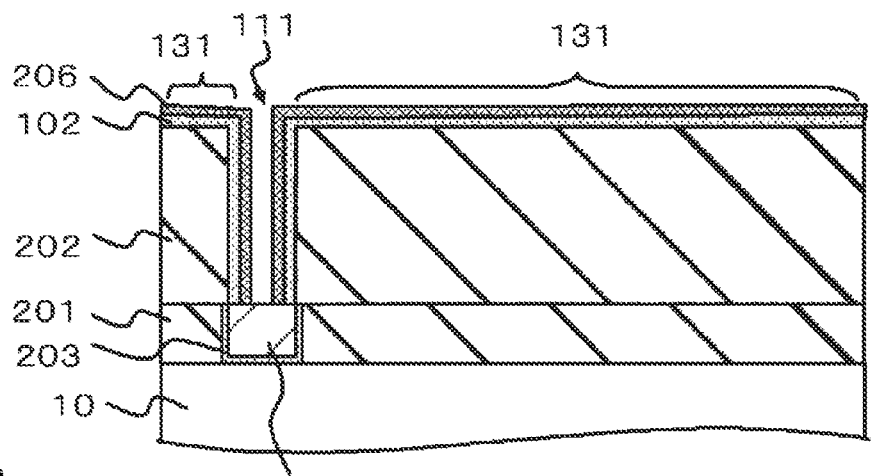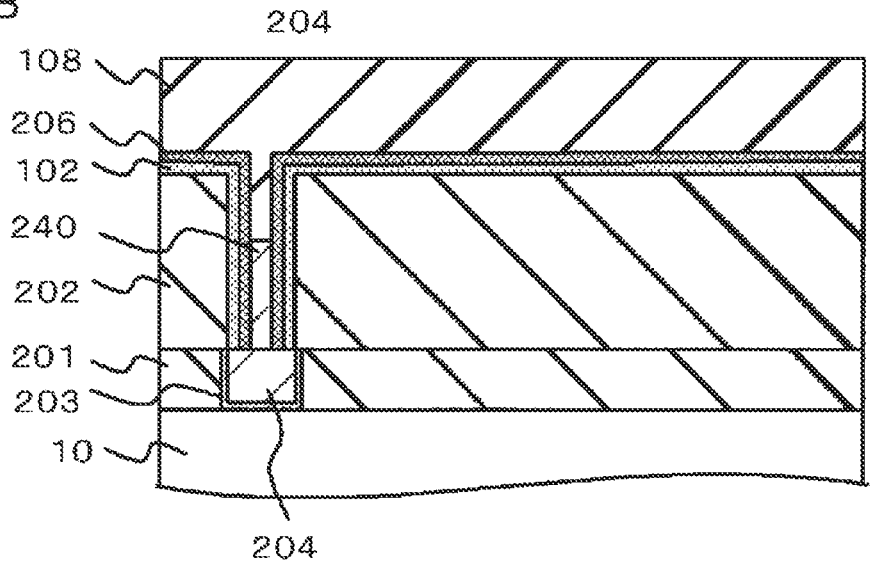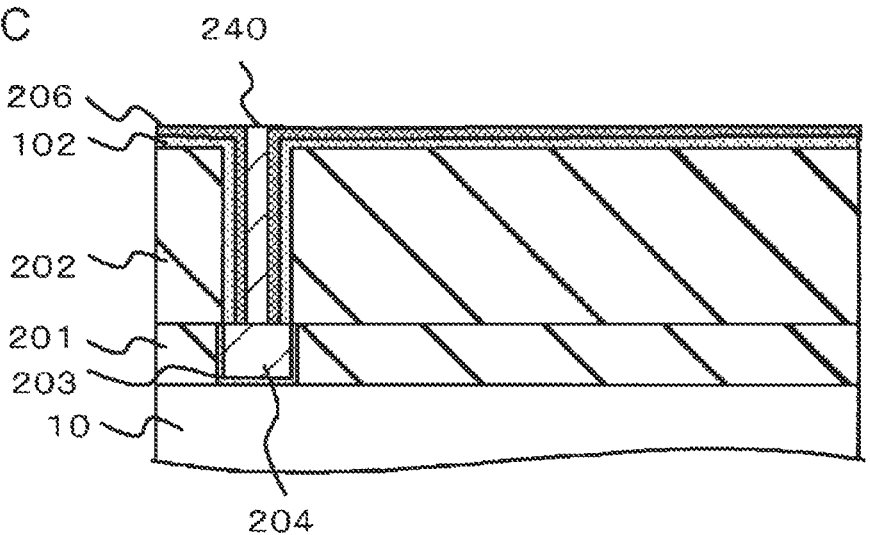

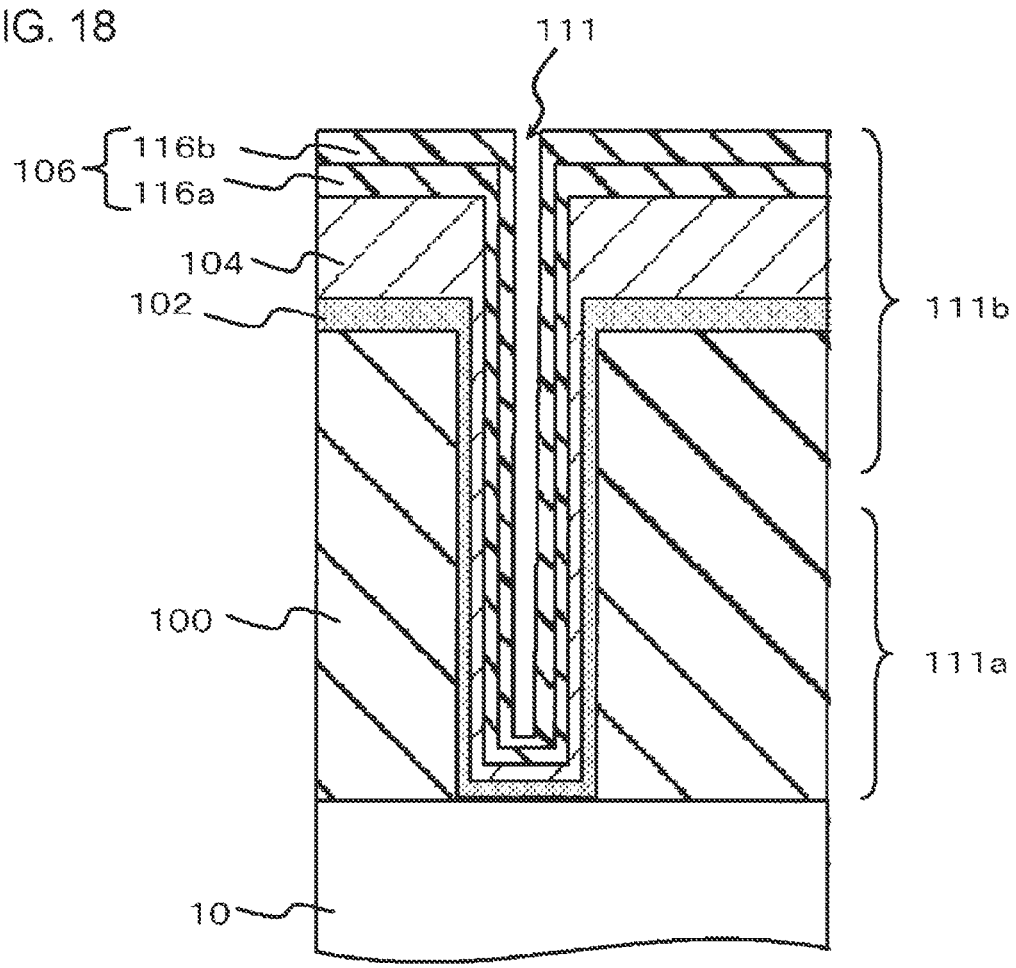

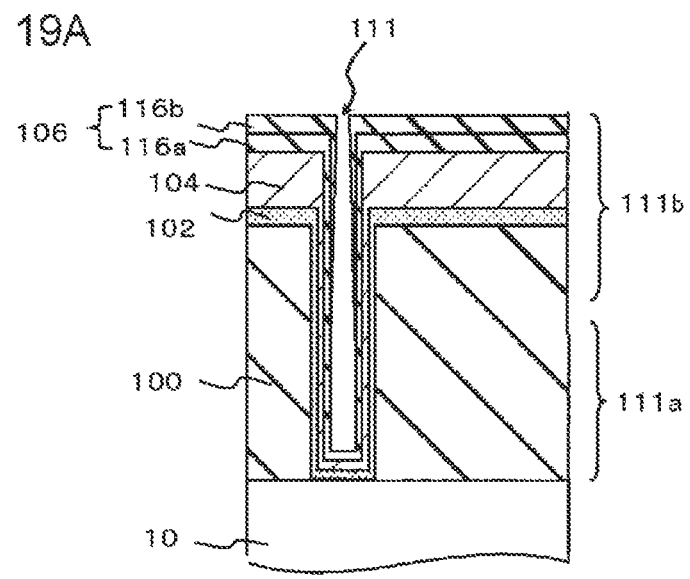
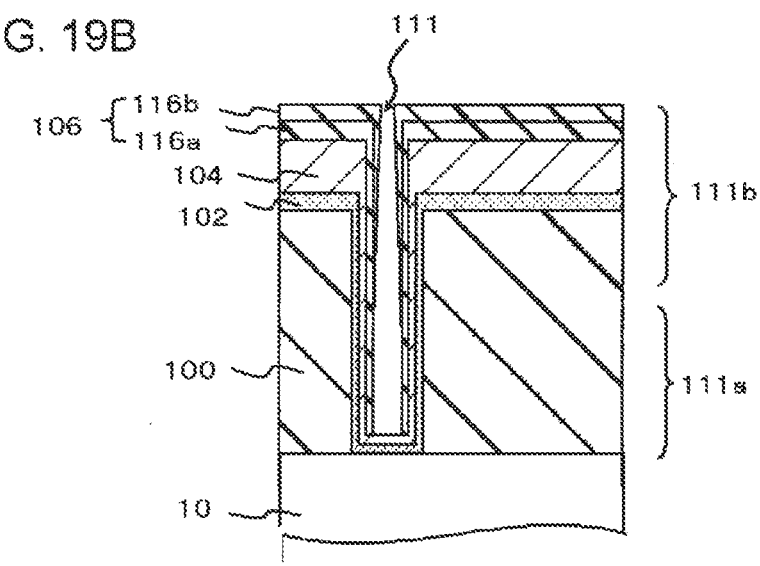

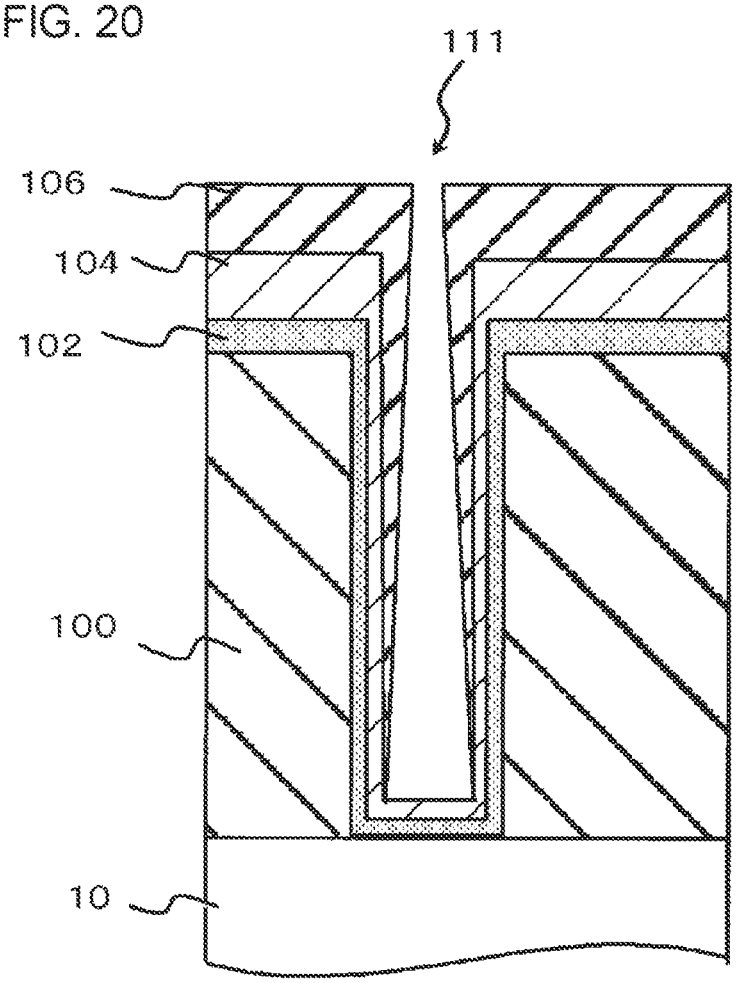

METHOD FOR MANUFACTURING A SEMICONDUCTOR DEVICE

CROSS REFERENCE TO RELATED APPLICATIONS

This application is a division of co-pending application Ser. No. 12/898,165 filed on Oct. 5, 2010, which claims foreign priority to Japanese application No. 2009-231131 filed on Oct. 5, 2009. The entire content of each of these applications is hereby expressly incorporated by reference.

BACKGROUND

1. Technical Field

The present invention relates to a semiconductor device and a method for manufacturing a semiconductor device. In particular, the present invention relates to interconnect structure that provides connection between semiconductor elements and a method for manufacturing thereof.

2. Background Art

A delay in a signal propagation through an interconnect limits a speed of an operation of a device in semiconductor devices of recent years. A delay constant through an interconnect is represented by a product of an interconnect resistance and a capacitance between interconnects. Thus, copper (Cu) having lower specific resistance is employed as an interconnect material in order to reduce the interconnect resistance to achieve faster operation of a device.

A Cu multiple-layered interconnect is formed by means of a damascene process. A damascene process typically includes: an operation of depositing an insulating film such as an interlayer insulating film; an operation of processing the insulating film to form a recessed section; an operation of depositing a barrier metal; an operation of depositing a Cu thin film, which is referred to as a Cu seed; an operation of filling the inside of the recessed section by means of a Cu plating deposition process by utilizing the Cu thin film as a cathode for an electrolytic plating process; an operation of removing portions of barrier metal and Cu deposited in sections other than the recessed section by means of a chemical mechanical polishing (CMP) process; and an operation of depositing a barrier insulating film.

FIGS. 21A to 21C are cross-sectional views of a semiconductor device, which are useful in describing operations for filling the inside of a recessed section by means of a conventional Cu deposition process. As shown in FIG. 21A, an insulating film 301 and an insulating film 302 are sequentially deposited over a substrate 30. Although detailed descriptions are not presented, the upper surface of the substrate 30 is provided with a semiconductor element such as a transistor, an interlayer insulating film for covering thereof, a contact for join the semiconductor element with the interconnect layer, and, according to the cases, an interconnect layers. A barrier metal film 203 and a Cu interconnect 304 are buried in a trench of the insulating film 301. A recessed section 315 is formed in the insulating film 302 disposed on the Cu interconnect 304, and a barrier metal film 312 and a Cu seed film 314 are sequentially deposited over a bottom surface and a side wall of the recessed section 315 and a surface of the insulating film 302. Then, as shown in FIG. 21B, an electrolytic plating film 340 composed of Cu is deposited over a surface of the Cu seed film 314 by means of a plating process by utilizing the Cu seed film 314 as a cathode electrode. FIG. 21B illustrates a cross-sectional view during the process of the Cu electrolytic plating operation.

A presence of a hollow space in a Cu interconnect in a Cu multiple-layered interconnect, which is referred to as a void, causes an increase in the resistance and a deterioration in the reliability, leading to a problem of reduced production yield of semiconductor devices (chips). Thus, it is important to carry out the Cu deposition (filling) without creating a void in the inside of the recessed section 315 formed in the insulating film 302 during the above-described electrolytic plating process. FIG. 21C illustrates a Cu interconnect after the Cu electrolytic plating process, where a hollow space referred to as a void is generated in the Cu interconnect. The characteristics of electrolytic plating is affected by an electric field intensity, and the deposition rate in an aperture of the recessed section 315, where stronger electric field intensity is present, is higher than that in the side walls of the recessed section 315, and therefore a failure in obtaining sufficiently higher growth rate on the bottom surface of the recessed section 315 causes unwanted closing of the aperture before the deposition of the plated film reaches to the aperture from the bottom surface. Such closure of the aperture causes a stop of a supply of metallic ions contained in a plating liquid into the recessed section 315 and a block of the electric field, so that the growth of the Cu plated film deposited over the bottom surface is stopped before reaching to the aperture, and thus the section in the recessed section 315 without the deposition of the plating process is remained to create a void. Thus, in order to inhibit a generation of such void, an approach of the deposition rate for filling with Cu is locally controlled to provide an increased deposition rate in the bottom surface of the recessed section 315 as compared with the deposition rates in the aperture and the side walls of the recessed section 315 by adding a deposition accelerator and a deposition suppressor to an electrolytic plating liquid. Such approach for the plating process is referred to as a bottom up fill or a super conformal fill.

Here, a polymer such as a copolymer of polyethylene glycol or polypropylene glycol is typically employed for the deposition suppressor. A sodium sulfonate is typically employed for the deposition accelerator.

Detailed mechanism of the bottom up fill is unidentified yet in the present time, and is estimated as follows.

A deposition suppressor and a deposition accelerator are contained in an ordinary electrolytic plating liquid. When a substrate having a seed formed in the inside and the outside of a recessed section is immersed in such electrolytic plating liquid, the deposition suppressor and the deposition accelerator are adsorbed on the surface of the seed with the rates that associates with the densities in electrolytic plating liquid. The actions of the deposition accelerator at the inside of the recessed section are not largely differed from those at the outside of the recessed section in the initial stage of the plating deposition process. However, the growth of the overall plated film leads to a growth of the film from the side walls of the recessed section in the inside of the recessed section, in particular the section around the bottom thereof, and therefore this provides reduced surface area of the seed in the inside of the recessed section. On the other hand, since the deposition accelerator adsorbed over the seed surface is not desorbed, the reduction of the surface area of the seed in the inside of the recessed section causes increased density of the deposition accelerator over the surface of the seed in such section. This results in relatively enhanced effect for accelerating the deposition in the inside of the recessed section, and therefore the rate of the deposition by means of the plating process over the seed in the inside of the recessed section is higher than that in the outside of the recessed section.

A bottom up growth is a process that utilizes the above-described phenomenon, and if the rate of the deposition by means of the plating process in the bottom of the recessed section is sufficiently higher than that in the aperture and the side walls of the recessed section, the plated film grown from the bottom can reach to the aperture before the aperture is closed, and thus the fill of the recessed section is achieved while generations of void in the inside of the recessed section is inhibited.

However, sufficient bottom up growth is not achieved with the conventional electrolytic plating liquids in the situation where the miniaturizations of the semiconductor device are progressed to involve the decreased dimension of the aperture of the recessed section. This is because the smaller dimension of the aperture causes insufficient increase in the concentration of the deposition accelerator over the bottom surface of the recessed section. Therefore, the aperture is closed with the plated film grown at the location of the aperture before the growth of the plated film grown from the bottom surface of the recessed section reaches to the aperture, to eventually form a void.

In order to solve such problem, for example, an approach for utilizing increased concentrations of Cu and sulfuric acid in the plating liquid and utilizing heavier polymerized materials for a plating suppressor and a leveler is disclosed by Jon Reid and Jian Zhou, entitled "Electrofill Challenges and Directions for Future Device Generations", Advanced Metallization Conference 2007 17/Asia Session. Reid et al. discloses that the increased concentration of sulfuric acid promotes an activation of the accelerator and the increased concentration of Cu provides enhanced precipitation probability, thereby providing improved bottom up performance. Reid et al. also discloses that the uses of heavier polymerized materials for the suppressor and the leveler cause reduced diffusion rates thereof in the plating liquid to provide reduced adsorption to the recessed section at the initial stage of plating deposition process, so that the concentration of the accelerator is increased in the recessed section to allow the bottom up even in the structure of the finer dimension.

However, according to investigations of the present inventors, the following problems are found in the above-described approach. The increases in the concentrations of Cu and sulfuric acid cause increased risks of a generation of particles due to a precipitation of copper sulfate and resultant device fault. In addition, since the plating suppressor and the leveler are decomposed in the use during the process, and therefore the effects of these agents disappear for the use in longer term. In order to prevent such problem, frequent replacement of the plating liquid is required, which leads to an increase in the production cost. Furthermore, this approach is to enhance the effect of the accelerator in the recessed section and is not related to alter the mechanism of the bottom up, and therefore the bottom up growth can not achieved in further finer dimension. More specifically, the bottom up growth is difficult to be achieved for semiconductor devices with progressed miniaturization, even if the improved plating liquid is presented, and causing problem of formation of a void in the Cu plated film.

Here, problem areas for of semiconductor devices having through silicon via (TSV) structure will be described in reference to FIG. 22 and FIGS. 23A and 23B. FIG. 22 shows a semiconductor device having a fine pattern with a conventional damascene structure, which includes an insulating film 52, which is formed over a substrate 10, which includes a transistor and a multiple-layered interconnect and the like formed on an element-formation surface of a semiconductor substrate 51. The insulating film 52 includes recessed sections 53 having apertures in the surface opposite to the side of the substrate 10. FIGS. 23A and 23B show a semiconductor device having the TSV structure, including a substrate 61, which is provided with a transistor, a multiple-layered interconnect layer, and an electrode pad and the like formed over an element-formation surface of the semiconductor substrate 51. The substrate 61 includes a recessed section 66 that extends through the multiple-layered interconnect layer to reach to the inside of the semiconductor substrate 51. An insulating film 62 is formed on the recessed section 66 and the substrate 61.

Since the TSV structure as shown in FIGS. 23A and 23B has larger pattern as compared with the fine pattern of the conventional damascene structures, the following problems are caused in the process for manufacturing the semiconductor devices.

First of all, as shown in FIG. 23A, the recessed section 66 having a diameter of about several tens micrometers (μm) and a height of tens to one hundred micrometers (μm) is formed over the substrate 61. Subsequently, as shown in FIG. 23B, a barrier metal 63 and a Cu film 64 serving as a seed are sequentially deposited over the substrate 61 and the recessed section 66. Then, the inside of recessed section 66 is filled with a Cu plated film 65 by means of a Cu plating deposition process by utilizing the Cu film 64 as a cathode electrode for the electrolytic plating process. Next, the sections of the barrier metal 63, the Cu film 64 and the Cu plated film 65 formed on the field of the substrate 61 are removed by means of a CMP process to present a configuration, in which the Cu plated film is remained only in the recessed section 66. In addition, the CMP process is further conducted until the Cu plated film in the recessed section 66 is exposed from the back surface of the substrate 61. This allows forming a through-hole electrode in the substrate 61.

The fill operation with the Cu plated film by employing the above-described plating deposition of Cu utilizes the bottom up growth similarly as in the process for finer pattern to fill with the Cu plated film 65, such fill process differs from the plating process for finer pattern, in terms of requiring larger amount of the plating deposition due to the larger pattern, which, in turn, requires a rapid deposition with a higher electric current for ensuring the sufficient production capacity. An attempt to increase the rate of the plating deposition requires an increase in the electric field intensity at the pattern aperture, causing the situation where the growth of the plated film around the aperture is faster than the increased speed of the bottom up, so that the aperture is blocked with the Cu plated film 65 deposited at the aperture. This causes the stop of the supply of the metallic ion to the recessed section from the plating liquid, which leads to the stop of the growth of the plated film or the plating deposition before the Cu plated film 65 deposited from the bottom surface reaches to the aperture, and the portion of the recessed section 66 without the deposition of the plated film remains to create a void, causing a problem of easily generating a defect in the process of the fill with the Cu plated film 65.

In order to solve the problem of generation the voids, technologies for carrying out the bottom up in the condition that the seed layer formed in the recessed section is partially remained only in the bottom of the recessed section, as described in Japanese Patent Laid-Open No. 2002-020,891 and Japanese Patent Laid-Open No. 2004-214,508.

Japanese Patent Laid-Open No. 2002-020,891 discloses a technology, which involves selectively removing a seed layer from an upper surface of a substrate to leave a portion of the seed layer only in at least a bottom surface of a feature (which is a representation described in Japanese Patent Laid-Open No. 2002-020,891 for indicating a trench), and then conducting an electrolytic plating process with a metal by utilizing a section of the seed layer to fill the feature with the metal. Japanese Patent Laid-Open No. 2004-214508 discloses a technology, which involves forming a metallic film on an electrically conducting layer that is remained over a bottom surface of an interconnect trench.

In addition to above, technologies related to electrolytic plating processes for semiconductor devices including conventional damascene structures are also disclosed in Japanese Patent Laid-Open No. 2007-149,824, Japanese Patent Laid-Open No. 2005-333,153, Japanese Patent Laid-Open No. 2001-144,181 and Japanese Patent Laid-Open No. 2002-118,109.

However, according to investigations of the present inventors, it was found that the following problems are present when technologies disclosed in the above-described Japanese Patent Laid-Open No. 2002-020,891 and Japanese Patent Laid-Open No. 2004-214,508 are applied.

The technologies described in the above-described Japanese Patent Laid-Open No. 2002-020,891 and Japanese Patent Laid-Open No. 2004-214,508 involve removing the portions of the seed film which was formed on the side walls of the recessed section by means of an electrolytic polishing process or a CMP process, in order to form the seed layer only on the bottom surface of the recessed section.

Thus, the Cu surface of the seed layer is possibly contaminated with a corrosion proof material employed in the CMP process or the like. In addition, sufficient removal of the seed layer from the side walls of the recessed section may not be achieved, or uniform removal may not be achieved.

Therefore, sufficient inhibition for the creation of voids may not be achieved.

Consequently, sufficient inhibition for voids generated during the electroplating fill cannot be achieved by employing the technologies described in the above-described Japanese Patent Laid-Open No. 2002-020,891 and Japanese Patent Laid-Open No. 2004-214,508.

SUMMARY

According to one aspect of the present invention, there is provided a method for manufacturing a semiconductor device, including: preparing a substrate having a recessed section and a seed film, the seed film being exposed to a bottom of the recessed section; forming an electroconductive film in the recessed section, the electroconductive film having lower plating deposition ability than the seed film; selectively removing the electroconductive film to expose the seed film over the bottom of the recessed section; and conducting a growth of a plated film to fill the recessed section by utilizing the portion of the seed film exposed over the bottom of the recessed section as a seed.

According to another aspect of the present invention, there is provided a semiconductor device, comprising: a substrate; and an electric conductor buried in the substrate, wherein the electric conductor has a point that represent the highest concentration of a metallic element except the constituent elements of the electric conductor in a region of the electric conductor defined with a distance from the side surface section toward a central section of equal to or larger than 1 nm and equal to or lower than 20 nm.

The present invention is directed to achieve an inhibition of a generation of a void in the inside of the recessed section during the fill of the recessed section of the substrate by the plating deposition. Consequently, the present invention, first of all, employs the substrate having the seed film exposed over the bottom of the recessed section, and in the next, the electroconductive film having lower plating deposition ability than the seed film is formed over the bottom section and the side surface sections within the recessed section, and then the portion of the electroconductive film disposed in the bottom section is removed to expose the seed film over the bottom section. As described above, an electrolytic plating process is conducted under the condition that the seed film is formed in the bottom section of the recessed section and the electroconductive film having lower plating deposition ability than the seed film is formed in the side surface sections, so that the seed film in the bottom section is preferentially grown by the plating process rather than the film in the side surface sections, so that the inside of the recessed section can be filled by the growth of the plated film from the bottom section. This allows inhibiting a generation of a void in the inside of the recessed section during the growth of the plated film.

According to the present invention, a semiconductor device with reduced generation of voids and a method for manufacturing the semiconductor device can be achieved.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 1A to 1C are cross-sectional views, illustrating an example of a process for manufacturing a semiconductor device according to first embodiment;

FIGS. 5A to 5C are cross-sectional views, illustrating an example of a process for manufacturing a semiconductor device according to second embodiment;

FIGS. 6A to 6C are cross-sectional views, illustrating the example of the process for manufacturing the semiconductor device according to second embodiment;

FIG. 18 is a cross-sectional view, illustrating an example of a process for manufacturing a semiconductor device according to seventh embodiment;

FIGS. 19A and 19B are cross-sectional views, illustrating the example of the process for manufacturing the semiconductor device according to seventh embodiment;

FIG. 20 is a cross-sectional view, illustrating a modified embodiment of a semiconductor device according to with the present embodiment;

DETAILED DESCRIPTION

Figure 2A:
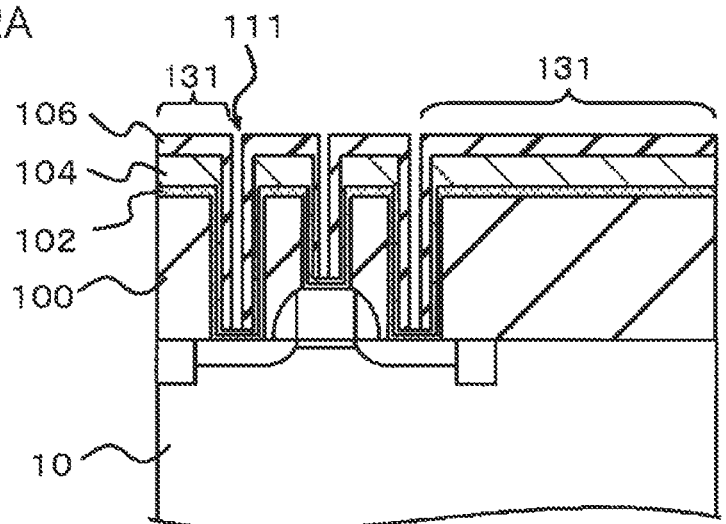
FIGS. 2A to 2C are cross-sectional views, illustrating the example of the process for manufacturing the semiconductor device according to first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations according to the present invention will be described in detail as follows in reference to the annexed figures. In all figures, an identical numeral is assigned to an element commonly appeared in the figures, and the detailed description thereof will not be repeated. Here, the preferable embodiments will be described in reference to directions defined as front and back (longitudinal), right and left (transverse) and upper and lower (vertical) directions. However, such directions are temporary presented for only the descriptive purposes in order to simply describe the relation of the elements. Therefore, it is not intended to limit the directions of the product in the production or in the use of the product according to the present invention. Here, unless otherwise noted, an insulating film, a barrier metal film, a seed film, a cover metallic film, a cap film, and a plated film are not limited to a monolayer (single layer) film, and may be a multiple-layered film.

First Embodiment

FIGS. 1A to 1C, FIGS. 2A to 2C and FIGS. 3A to 3C are cross-sectional views, illustrating an example of a process for manufacturing a semiconductor device according to first embodiment. FIG. 4A is a cross-sectional view, illustrating the example of the process for manufacturing the semiconductor device according to first embodiment, and FIG. 4B is a cross-sectional view, useful in describing an advantageous effect of the process for manufacturing the semiconductor device according to first embodiment.

An example of a process for manufacturing a semiconductor device according to first embodiment will be described in reference to FIGS. 1A to 1C, FIGS. 2A to 2C, FIGS. 3A to 3C and FIGS. 4A and 4B. First of all, a method for manufacturing a semiconductor device includes: an operation of forming recessed sections 111 in an insulating film 100, which is formed on a semiconductor substrate 10 that is provided with an element such as a transistor and the like formed on the surface thereof; an operation of forming a barrier metal film 102 and a seed film 104 in the recessed section 111; an operation of forming a cover metal film 106 in the recessed section 111; an operation of selectively removing the cover metal film 106 to expose the seed film 104 over the bottom section of the recessed section 111; and an operation to carrying out a growth of a plated film 140 to fill the recessed section 111 by utilizing the seed film 104 exposed in the bottom section of the recessed section 111 as a seed. Detailed description will be made below.

As shown in FIG. 1A, the insulating film 100 is formed over the semiconductor substrate 10, and the recessed sections 111 are formed on the insulating film 100. The semiconductor substrate 10 is provided with, for example, a field effect transistor (FET) formed thereon, which includes a diffusion layer functioning as a source-drain region and a gate electrode.

As shown in FIG. 1B, the barrier metal film 102 and the seed film 104 are sequentially formed over the insulating film 100 and the recessed sections 111. The barrier metal film 102 and the seed film 104 may be formed by, for example, a physical vapor deposition such as sputter deposition process, a chemically-oriented vapor deposition process such as chemical vapor deposition (CVD) process and atomic layer deposition (ALD) process, a liquid phase deposition process, or a supercritical fluid growth process. However, the deposition under the condition for preventing a formation of thicker film at the aperture of the recessed section 111 may be preferably selected.

As shown in FIG. 1C, the cover metal film 106 is formed on the seed film 104. The cover metal film 106 is, for example, formed over the bottom section and the side surface sections of the recessed section 111 and over the insulating film 100 by employing an ionized sputter deposition process. In such case, the portion of the cover metal film 106 formed over the bottom section of the recessed section 111 has a thickness that is smaller than the portion of the cover metal film 106 formed on the insulating film 100.

As shown in FIG. 2A, a selective etching process is carried out to remove the portion of the cover metal film 106 on the bottom section of the recessed section 111, thereby exposing the seed film 104 over the bottom section. A typical technique of the selective etching process may be, for example, removing the portion of the cover metal film 106 on the bottom section of the recessed section 111 by accelerating ions travelling toward the bottom section of the recessed section 111 from a plasma through a technique of applying radio frequency (RF) bias or the like, so that the portions of the cover metal film 106 are remained on the side surface sections of the recessed section 111 and the upper surface of the portions of the seed film 104 formed in regions other than the recessed section 111 (field section 131) over the insulating film 100. Since the thickness of the film disposed in the inside of the trench is smaller than the film disposed over the field, such structure can be easily created by suitably controlling the etch time. The removal of the cover metal film 106 to the extent of at least partially exposing a portion of the seed film 104 on the bottom section is sufficient, and it is not necessary to completely remove the entire portion of the cover metal film 106 located on the bottom section of the recessed section 111. In addition, a portion of the cover metal film 106 in a region in vicinity of the bottom section, or more specifically, for example, in a region having an aspect ratio not larger than 1 defined from the bottom surface, may be removed, in addition to the removal of the film on the bottom section of the recessed section 111. This provides a structure having the recessed section 111 and also having the seed film 104 exposed on the bottom section of the recessed section 111. In addition to above, in order to obtain an optimum feature of the cover metal film 106, the deposition of the cover metal film 106 and the selective etching may be repeated. Alternatively, a wet etching process with a solution may also be available for the selective etching process. Suitable etchant solution may be selected in view of the etching selectivity between the Cu seed film and the barrier metal film and/or an influence of the battery cell effect, and for example, in the case of employing titanium (Ti), hydrofluoric acid or ammonia hydrogen peroxide solution may be employed. Such wet etching process may also be similarly applicable in other embodiments as described hereinafter.

In the present embodiment, for example, a material composed of tantalum nitride (TaN) having tantalum (Ta) stacked thereon may be employed for the barrier metal film 102. In addition, the barrier metal film 102 may be deposited to have a thickness of 1 to 20 nm.

In the present embodiment, for example, Cu is employed as a material for the seed film 104. In addition, the seed film 104 may be deposited to have a thickness of 10 to 100 nm.

In the present embodiment, the cover metal film 106 is an electroconductive film having poor and lower plating deposition ability than the seed film 104.

In the present embodiment, titanium (Ti) is employed for a material of the cover metal film 106. In addition, the cover metal film 106 is formed to have a thickness of 0.5 to 10 nm a field section 131 on the insulating film 100 and a thickness of 0.5 to 5 nm over the side surface sections of the recessed section 111. The thickness of the cover metal film 106 may be preferably about 0.5 to 1 atomic layer or larger in both of the side surface sections of the recessed section 111 and the field section 131 over the upper surface of the seed film 104. This allows inhibiting the growth of the plated film and reducing the generation of voids in the side surface sections of the recessed section 111 and in the field section 131 over the upper surface of the seed film 104 during an operation of a plating deposition, as discussed later.

Figure 2B:
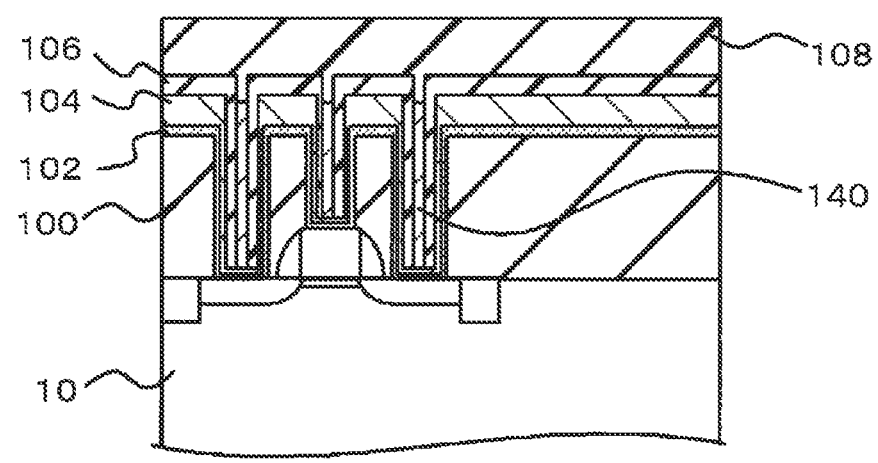
Figure 2C:
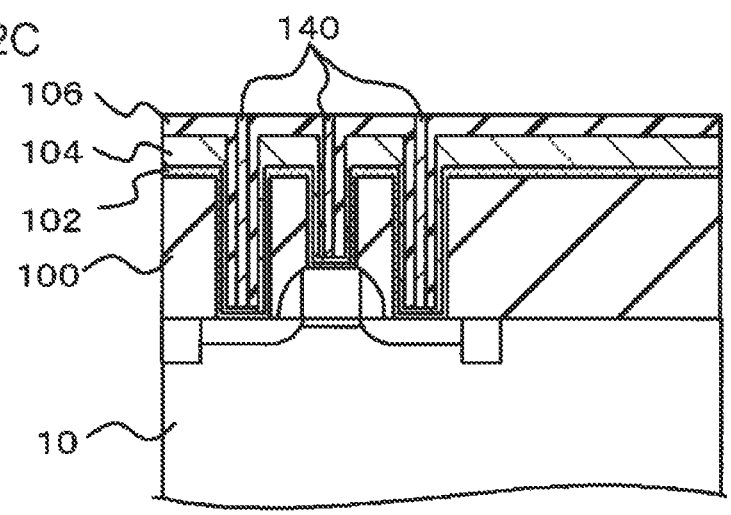

Then, a plating process is conducted by employing an electrolytic plating liquid 108. As shown in FIGS. 2B and 2C, the growth of the plated film 140 is achieved by utilizing the seed film 104 exposed in the bottom section of the recessed section 111 as the seed to fill the recessed section 111.

An electric current density of the plating process may be preferably, for example, about 0.1 A/dm$^2$ to 10 A/dm$^2$. However, increased electric current density may cause a plating deposition on the cover metal film 106 in the case of employing a certain material for the cover metal film 106. However, even in such case, a person having ordinary skills in the art may appropriately provide an optimized result. In addition, the value of the electric current is presented by a product of the electric current density and the ratio of the aperture of the recessed section 111 over the dimensional area of the wafer.

In the operation of conducting the growth of the plated film 140 to fill the recessed section 111 through the growth of the plated film 140 by utilizing the portion of the seed film 104 exposed to the bottom section of the recessed section 111 as a seed for the plating, the plated film 140 may be preferably a plated film 140b, in which the plated film 140 may form a protruded section over the aperture of the recessed section 111, so that the protruded section has a height of equal to or higher than 1 nm and equal to or lower than 100 nm (see FIG. 4A). Such structure allows a thermal shrinkage of the plated film 140 deposited through the plating process in the concave section 111 by the first thermal processing conducted in the subsequent process to avoid a creation of a space in the concave section 111 (see FIG. 4B).

Next, the first thermal processing is conducted so that the metallic element contained in the cover metal film 106 diffuses in the plated film 140. This allows a unification of the seed film 104 and the plated film 140 by recrystallization to form a plated film 140a. In addition, Ti contained in the cover metal film 106 diffuses in the plated film 140a to form a cap film 106a on the surface of the plated film 140a (see FIG. 3A). Further, a region 106b containing a chemical element constituting the cover metal film 106 at higher concentration than other chemical elements in the peripheral areas is formed. In the present embodiment, a concentration of Ti in the region 106b is higher than a concentration of Ti in the peripheral areas.

The first thermal processing may be conducted at a heated temperature of, for example, 100 degrees C. to 400 degrees C. In addition, the surface of the seed film 104 may be exposed to a plasma of an atmosphere of ammonia or nitrogen in the thermal processing. This allows a diffusion of Ti with improved uniformity.

Figure 3A:
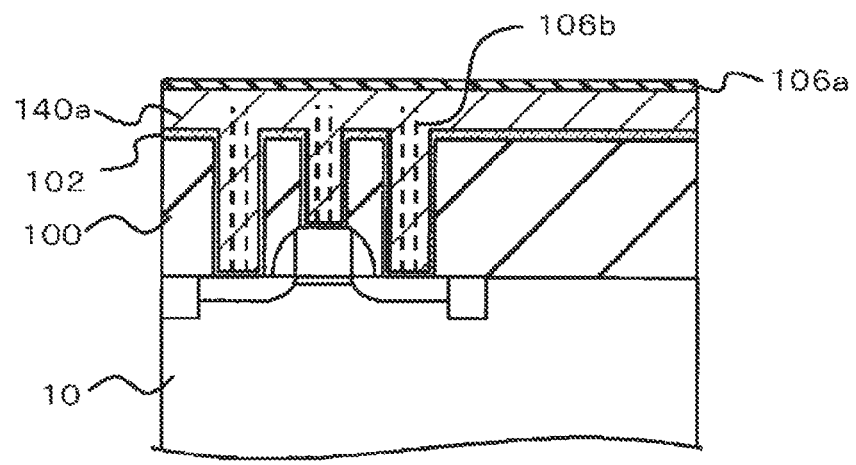
FIGS. 3A to 3C are cross-sectional views, illustrating the example of the process for manufacturing the semiconductor device according to first embodiment.
Figure 3B:
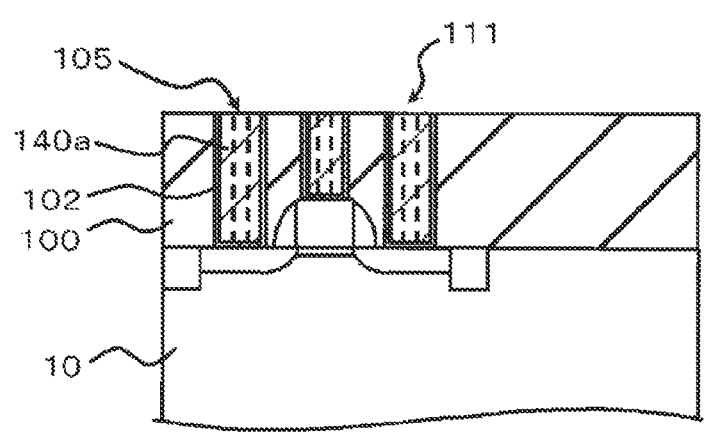
Figure 4A:
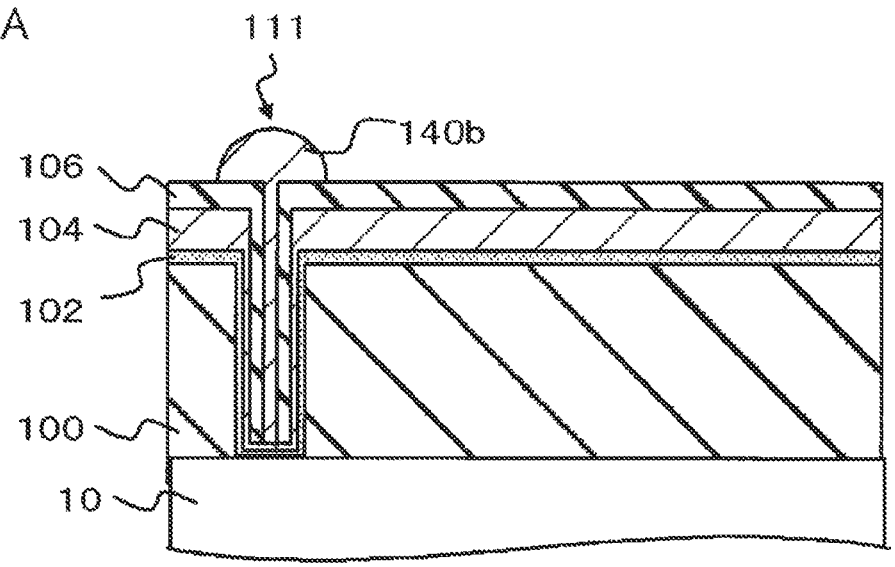
FIG. 4A is a cross-sectional view, illustrating the example of the process for manufacturing the semiconductor device according to first embodiment.
Figure 4B:
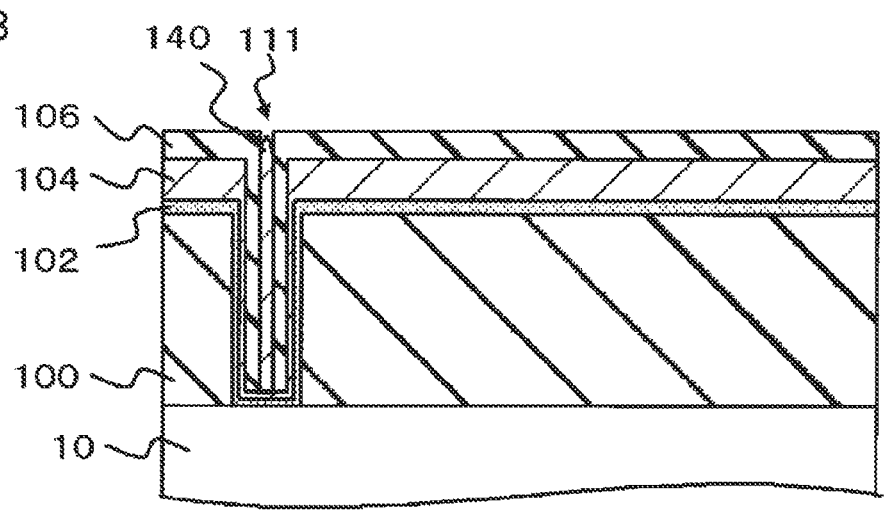
FIG. 4B is a cross-sectional view, useful in describing an advantageous effect of the process for manufacturing the semiconductor device according to first embodiment.

As shown in FIG. 3B, the cap film 106a, the plated film 140a and the barrier metal film 102 are selectively removed by means of a CMP process to planarize the surface, thereby leaving the plated film 140a only in the concave section 111. This provides a Cu interconnect 105 formed in the insulating film 100.

Figure 3C:
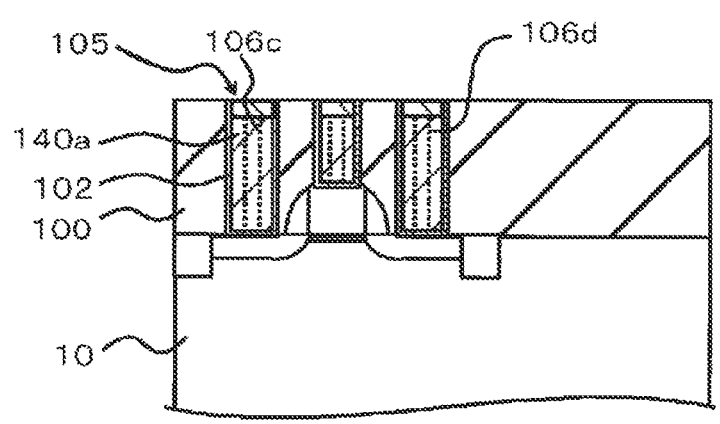

Next, the second thermal processing is conducted so that a segregation of a metallic element contained in the cover metal film 106 is caused in vicinity of the surface of the plated film 140a (Cu interconnect 105) that is remained only within the concave section 111. This allows that atomic element such as Ti originated in the cover metal film 106 on the surface of the Cu interconnect 105 and remained at a very small amount in the Cu interconnect 105 is segregated in the surface of the Cu interconnect 105 to form a cap film 106c (FIG. 3C). The cap film 106c has a Cu concentration that is lower than the Cu interconnect 105 and covers the upper surface of the Cu interconnect 105.

In addition, Ti in the cover metal film 106 is capable of more uniformly diffusing. As shown in FIG. 3C, the concentration of atomic element constituting the cover metal film 106 in the region 106b is further reduced to form a region 106d. In addition to above, the region 106d is a region having higher concentration of atomic element constituting the cover metal film 106 than atomic elements in the peripheral regions.

The second thermal processing, which is conducted after the structure shown in FIG. 3B is formed by forming the element such as the transistor and the interconnect structure on the semiconductor substrate 10, may be conducted at a temperature within a range of, for example, from 100 degrees C. to 400 degrees C.

The cap film 106c may contain Cu at a concentration that is smaller than the Cu concentration of the seed film 104, and may also contain at least one atomic element of titanium, (Ti), aluminum (Al), tin (Sn) and manganese (Mn).

The first thermal processing and the second thermal processing may be conducted in an atmosphere containing oxygen and/or water. This allows forming an oxide over the surface of the plated film 140a, so as to accelerate a diffusion of the metallic element contained in the cover metal film 106 in the inside of the plated film 140a. In addition, when the metallic element contained in the cover metal film 106 is Ti, the thermal processing conducted in an atmosphere containing ammonia and nitrogen further accelerates the segregation of titanium nitride (TiN) on the surface of the plated film 140a, in addition to the above-described advantageous effect, thereby providing improved reliability. Further, the surface of the plated film 140a may additionally be exposed to a plasma of such atmosphere in the thermal processing process.

Such procedure provides the semiconductor device that includes the semiconductor substrate 10 having the transistor formed therein and the Cu interconnect 105 buried in the insulating film 100 formed thereon, in which the Cu interconnect 105 has a point that represent the highest concentration of a metallic element except Cu in the Cu interconnect 105 in a region of the Cu interconnect 105 defined with a distance from the side surface section toward a central section of equal to or larger than 1 nm and equal to or lower than 20 nm, and in which the device includes the barrier metal film 102 provided between the semiconductor substrate 10 and the side surface of the Cu interconnect 105 (FIG. 3C).

In the Cu interconnect 105, the Cu interconnect 105 has a point that represent the highest concentration of a metallic element except Cu in the Cu interconnect 105 in a region of the Cu interconnect 105 defined with a distance from the side surface section toward a central section of equal to or larger than 1 nm and equal to or lower than 20 nm.

Next, the advantageous effects of the present embodiment will be described.

In the present embodiment, the insulating film 100 is first formed on the semiconductor substrate 10 having the transistor or the like formed therein, and then the recessed sections 111 are formed in the insulating film 100, and the seed film 104 and the cover metal film 106 (electroconductive film having lower plating deposition ability than the seed film) are sequentially formed in the recessed section 111, and then, the portion of the cover metal film 106 in the bottom section of the recessed section 111 is removed to expose the seed film 104 in the bottom section of the recessed section 111. As described above, an electrolytic plating process is conducted under the condition that the seed film 104 is formed in the bottom section of the recessed section 111 and the cover metal film 106 is formed in the side surface sections thereof, so that the seed film 104 in the bottom section is preferentially grown by the plating process rather than the film in the side surface sections, so that the inside of the recessed section 111 can be filled by the growth of the plated film 140 from the bottom section. This allows inhibiting a generation of a void in the inside of the recessed section 111 during the growth of the plated film 140.

It is considered that the reasons for the cover metal film 106 to have lower plating deposition ability than the seed film 104 are as follows.

The first reason is that the cover metal film 106 contains metallic elements having higher resistance as compared with the seed film 104, so that electric current preferentially flows through the seed film 104 as compared with the cover metal film 106 on the side surfaces of the recessed section 111 to provide referential grow by the plating process.

The second reason is that, when Ti is employed for the cover metal film 106, the surface of the cover metal film 106 is oxidized, so that the reductive reaction is hard be progressed to allow the plating deposition of the seed film 104 is preferentially achieved.

Therefore, the portion of the seed film 104 exposed over the bottom section is preferentially grown, as compared with the portions on the side surfaces of the recessed section 111 when the plating deposition of the plated film 140 is conducted, and therefore a generation of a void in the inside of the recessed section 111 can be inhibited. Thus, the bottom up deposition can be achieved even though the opening of the recessed section 111 is smaller.

In addition, the cover metal film 106 contains Ti as a major constituent in the present embodiment. Therefore, according to the above-described second reason, the plating deposition over the cover metal film 106 can be further inhibited.

The conventional technology also requires an operation of removing the portion of the seed film formed on the upper surface of the substrate by means of a CMP processes, in addition to removing the portions of the seed film formed on the side surfaces in the recessed section, after the seed film is formed on the substrate having the recessed section and before conducting the electrolytic plating operation, in order to leave the seed film only in the bottom section of the recessed section on the substrate. This causes adding necessary operations, causing an increased cost and a deterioration of the productivity. On the contrary, the present embodiment requires no operation of removing the seed film 104 before the electrolytic plating operation.

Further, in the present embodiment, the cover metal film 106 is formed in the field section 131 on the seed film 104. Therefore, substantially no deposition by means of the plating deposition is made over the field section 131. This achieves the plating deposition in the recessed section 111, so that the processing time in the CMP process after the electrolytic plating process for removing the plated film 140 grown on the field section 131 can be reduced. While larger amount of the processing time for such CMP process is particularly required in the process for manufacturing the semiconductor device in the conventional technology, the present embodiment provides a limitation for the formation of the plated film 140 on the field section 131, such that the process time taken for the CMP process is reduced, thereby reducing the process time for manufacture the semiconductor device to provide improved productivity, and at the same time reducing the amount of the CMP abrasive material to provide reduced production cost.

While the plated film 140 is partially formed as the cover metal film 106 formed on the field section 131 is uneven, the present embodiment reduces the formation of the plated film 140 on the field section 131 in such case, so that the process time for manufacturing the semiconductor device can be reduced, thereby providing improved productivity.

In addition, as described in the above-described Reid et al., a Cu plating additive having larger molecular weight is required in the conventional technique, it is necessary to frequently change the plating solution in order to prevent degradation of the performance due to the decomposition and the consumption of the solution, and thus the production cost is increased. On the contrary, the present embodiment requires no use of a special additive, so that reduction of the production cost is achieved.

The semiconductor device also has the cap film 106c in the surface of the Cu interconnect 105 in the recessed section 111. This allows providing improved reliability of the Cu interconnect 105.

Further, other advantageous effects of the present embodiment will be described in reference to FIGS. 4A and 4B.

As shown in FIG. 4A, a plated film 140b including a protruded section having a generally hemispherical shape may be formed by the plating deposition on the recessed section 111 in the present embodiment. The reason for the configuration is that, when a plurality of recessed sections 111 are formed on a substrate, the positions of the recessed sections 111 in the surface of the substrate or the positional relations therebetween are different, and therefore there are the recessed section 111 with faster fill by plating deposition and the recessed section 111 with slower fill. Therefore, when the fill for the recessed section 111 with slower fill is completed, the plated film in the recessed section 111 with faster fill further grows in regions other than the inside of the recessed section 111 to form the plated film 140b having a protruded section on the recessed section 111, and a portion thereof is also formed on the field section 131. On the contrary, when the fill is conducted with the plated film 140 only in the inside of the recessed section 111, a thermal processing conducted later may cause a shrinkage of the plated film 140 in vicinity of the opening the recessed section 111 as shown in FIG. 4B.

To solve the problem, the plated film 140b having the protruded section of generally hemispherical shape is formed over the recessed section 111, so that the shrinkage of the plated film 140 in vicinity of the opening the recessed section 111 due to the thermal processing can be reduced.

While the above-described embodiment describes the use of the material having Ta serving as the barrier metal film 102 formed on TaN, a multiple-layered material having one of, or two or more of, titanium (Ti), ruthenium (Ru), iridium (Ir) and tungsten (W) may alternatively be employed.

Second Embodiment

While the operation of preparing the substrate having the recessed section 111 and also having the seed film 104 exposed on the bottom section of the recessed section 111 includes forming the recessed sections 111 and depositing the seed film 104 in the recessed sections 111 in first embodiment, second embodiment involves forming the seed film 204 before the formation of the recessed section 111 without conducting an operation of depositing a seed film in the recessed section 111.

An example of a process for manufacturing a semiconductor device according to second embodiment will be described in reference to FIGS. 5A to 5C, FIGS. 6A to 6C and FIGS. 7A to 7C. In the present embodiment, a process for manufacturing a semiconductor device includes: an operation of forming insulating film 201 (first insulating film) on a semiconductor substrate 10; an operation of filling a trench formed in the insulating film 201 (first insulating film) with a seed film 204; an operation of forming an insulating film 202 (second insulating film) on the insulating film 201 (first insulating film); an operation of selectively removing the insulating film 202 (second insulating film) is selectively removed to form a recessed section 111 and to expose the seed film 204 on the bottom section of the recessed section 111; an operation of forming the cover metal film 106 in the recessed section 111; an operation of selectively removing the cover metal film 106 to expose the seed film 204 on the bottom section of the recessed section 111; and an operation of carrying out a growth of a plated film 240 by utilizing the seed film 204 exposed in the bottom section of the recessed section 111 as a seed to achieve the growth of the plated film 240 that fills the recessed section 111. Detailed description will be made below.

As shown in FIG. 5A, the insulating film 201 is formed on the semiconductor substrate 10. While descriptions are not presented, the upper surface of the semiconductor substrate 10 is provided with a semiconductor element such as a transistor, an interlayer insulating film covering thereof, a contact for joining the semiconductor element with the interconnect layer, and according to the circumstances, an interconnect layer and the like. Subsequently, an interconnect trench is formed in the insulating film 201, and a barrier metal film 203 and the seed film 204 are sequentially formed to fill the inside of the trench. Subsequently, the insulating film 202 is formed on the insulating film 201. Next, the insulating film 202 is selectively removed to form the recessed section 111, and to expose the seed film 204 on the bottom section of the recessed section 111. This provides a structure having the recessed section 111 and also having the seed film 204 exposed on the bottom section of the recessed section 111.

In the present embodiment, the seed film 204 may be a Cu interconnect in the underlying interconnect layer or Cu via of a via layer or the like.

Next, as shown in FIG. 5B, the barrier metal film 102 is formed over the insulating film 202 and the seed film 204.

The barrier metal film 102 may be formed by, for example, a physical vapor deposition such as sputter deposition process, a chemically-oriented vapor deposition process such as CVD process and ALD process, a liquid phase deposition process, or a supercritical fluid growth process. However, the deposition under the condition for preventing a formation of thicker film at the aperture of the recessed section 111 may be preferably selected.

Subsequently, a selective etching process is carried out to remove the portion of the barrier metal film 102 on the bottom section of the recessed section 111, thereby exposing the seed film 204 (FIG. 5B). In this case, the portion of the barrier metal film 102 on the bottom section of the recessed section 111 is removed by accelerating ions travelling toward the bottom section of the recessed section 111 from a plasma through a technique of, for example, applying RF bias or the like, so that the portions of the barrier metal film 102 are remained on the side surface sections of the recessed section 111 and the regions other than the recessed section 111 over the insulating film 202 (field section 131).

As shown in FIG. 5C, a cover metal film 206 is formed on the barrier metal film 102. The cover metal film 206 is, for example, formed over the bottom section and the side surface sections of the recessed section 111 and over the barrier metal film 102 by employing an ionized sputter deposition process.

As shown in FIG. 6A, a selective etching process is carried out to remove the portion of the cover metal film 206 on the bottom section of the recessed section 111, thereby exposing the seed film 204. In this case, the portion of the cover metal film 206 on the bottom section of the recessed section 111 is removed by accelerating ions travelling toward the bottom section of the recessed section 111 from a plasma through a technique of, for example, applying RF bias or the like, so that the portions of the cover metal film 206 are remained on the side surface sections of the recessed section 111 and the regions other than the recessed section 111 over the insulating film 202 (field section 131).

In the present embodiment, a material mainly containing, for example, ruthenium (Ru) is employed for the barrier metal film 102. In addition, the barrier metal film 102 may be formed on, for example, the field section 131 over the insulating film 202 at a thickness of 1 to 10 nm, and on the side surfaces of the recessed section 111 at a thickness of 0.5 to 1 nm.

In the present embodiment, the cover metal film 206 is an electroconductive film having lower plating deposition ability than the seed film 204. Aluminum (Al), for example, may be employed as the material for the cover metal film 206. The cover metal film 206 may be formed on, for example, the field section 131 over the insulating film 221 at a thickness of 1 to 10 nm, and on the side surfaces of the recessed section 111 at a thickness of 0.5 to 1 nm.

In next, similarly as in the above-described embodiment described in reference to FIGS. 2B and 2C, first of all, a plating process with an electrolytic plating solution 108 is conducted by utilizing the seed film 204 exposed over the bottom section of the recessed section 111 as a seed to carry out the growth of the plated film 240 (FIG. 6B). This achieves a selective growth of the plated film 240 on the seed film 204 from the bottom section of the recessed section 111, thereby achieving the plated film 240 being buried in the recessed section 111 (FIG. 6C).

The subsequent operations are similar to the above-described embodiment. First of all, a first thermally processed process is conducted. This allows a unification of the seed film 204 and the plated film 240 by recrystallization to form a plated film 240a.

Figure 7A:
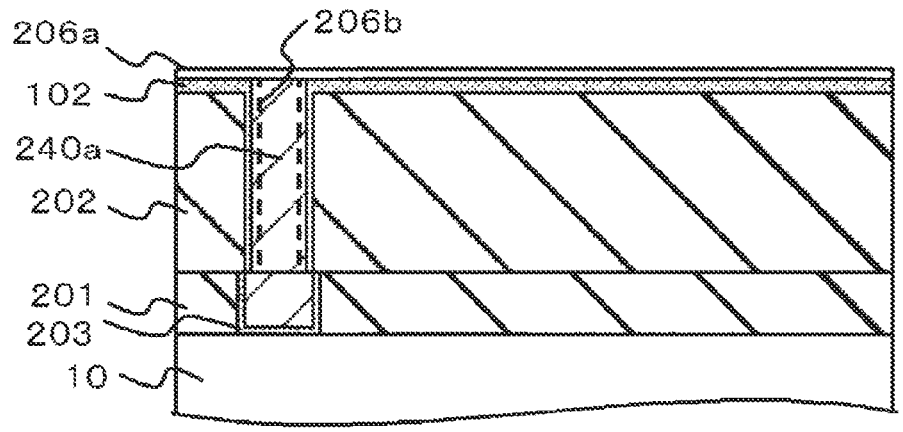
FIGS. 7A to 7C are cross-sectional views, illustrating the example of the process for manufacturing the semiconductor device according to second embodiment.
Figure 7B:
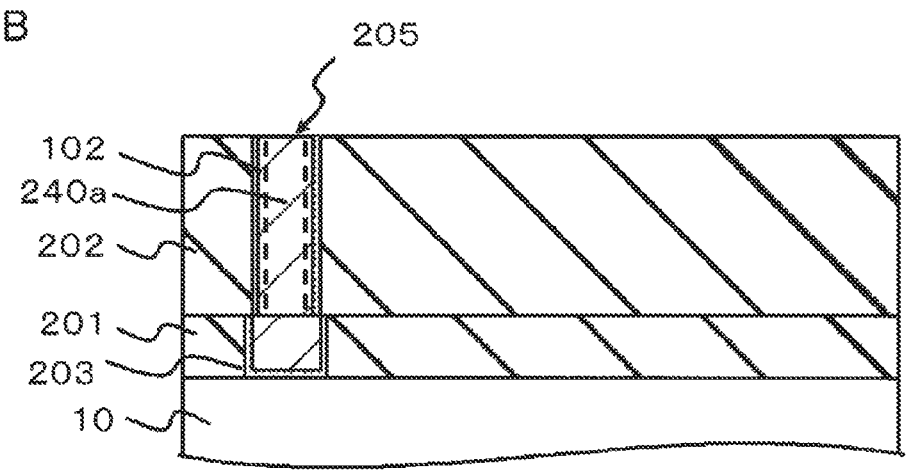

In addition, a constituent element such as aluminum (Al) contained in the cover metal film 206 diffuses in the plated film 240a to form a cap film 206a (see FIG. 7A). Further, a region 206b containing a chemical element constituting the cover metal film 206 at higher concentration than other chemical elements in the peripheral areas is formed. Then, the cap film 206a, the barrier metal film 102 and the plated film 240a are selectively removed by means of a CMP process to planarize the surface to form a Cu interconnect 205 (FIG. 7B).

Figure 7C:
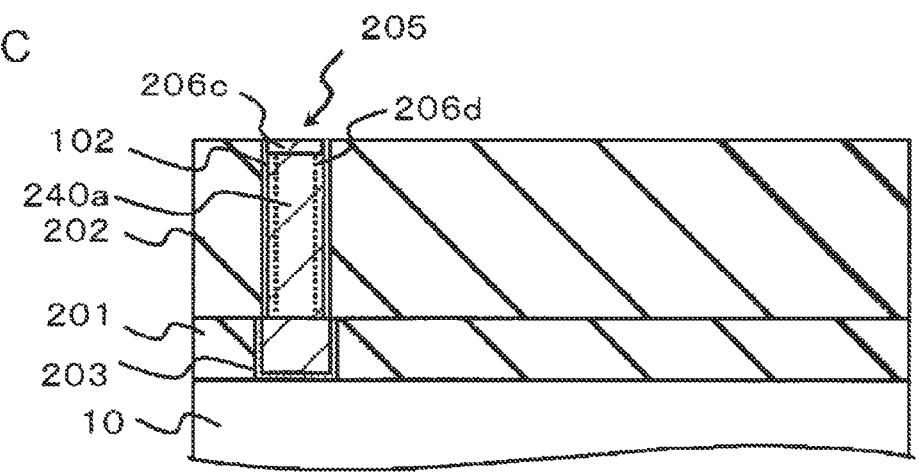

Further, a second thermally processing is conducted to generate a segregation in the surface of the Cu interconnect 205, thereby forming the cap film 206c (FIG. 7C). In addition, a concentration of an atomic element constituting the cover metal film 206 diffuses with improved uniformity. As shown in FIG. 7C, the concentration of the atomic element constituting the cover metal film 206 in the region 206b is further decreased to form a region 206d. In addition to above, the region 206d is a region having higher concentration of atomic element constituting the cover metal film 206 than atomic elements in the peripheral regions.

Advantageous effects in the present embodiment will be described. In the present embodiment, the insulating film 200 has the seed film 204, and the insulating film 202 is formed on the insulating film 200, and the seed film 204 is exposed in the bottom section when the recessed section 111 is formed in the insulating film 202. To solve the problem, the plated film 240 is grown by utilizing the exposed seed film 204 as a seed, so that an operation of forming a seed film is not required after the formation of the recessed section 111. In addition, since the Cu interconnect of the underlying interconnect layer or the Cu via of the via layer may be utilized as the seed film 204, there is no need to daringly form the seed film 204. Consequently, no additional operation of forming the seed film 204 is required in the second embodiment and no operation of forming a seed film after forming the recessed section 111 is required, so that the number of the process operations in the manufacturing process is reduced, as compared with first embodiment.

When Al is employed as a seed in the conventional technology, a Cu plated film is also deposited Al on the field in the subsequent Cu plating process, and thus the Cu plated film formed on the field is required to be removed. On the contrary, the cover metal film 206 is formed on the field section 131 in the present embodiment, so that the plated film 240 has poor plating deposition ability. Therefore, in the present embodiment, the operation of removing the plated film 240 grown on the field section 131 by means of the plating process may be omitted or simplified.

Further, according to the present inventors, the use of Al as a seed requires a special additive, which is not used in the conventional Cu plating fill, for the purpose of a nucleation for the plating deposition. However, a plating process is achieved in the present embodiment without employing a special additive, so that reduced production cost can be achieved. Other advantageous effects are similar to that in the above-described first embodiment.

It is intended that the present invention is not limited to the above-described embodiment, and various modifications thereof may also available. For example, while the present embodiment is described in reference to the process, in which the cover metal film 206 is formed after the removal of the barrier metal film 102 formed in the bottom section of the recessed section 111 and then the cover metal film 206 formed in the bottom section of the recessed section 111 is removed, an alternative process may also available, in which the cover metal film 206 is formed without removing the barrier metal film 102 formed in the bottom section of the recessed section 111, and the barrier metal film 102 and the cover metal film 206 are simultaneously removed in the bottom section of the recessed section 111.

Third Embodiment

While second embodiment illustrates the configuration of employing the cover metal film 206 and the barrier metal film 102 as the electroconductive films having lower plating deposition ability than the seed film 204, third embodiment illustrates a configuration of employing a film 107, which serves as both functions as a barrier metal film and as a cover metal film.

An example of a process for manufacturing a semiconductor device according to third embodiment will be described in reference to FIGS. 8A to 8C. A barrier metal film 203 and a seed film 204 are sequentially disposed to be buried in an insulating film 201 (first insulating film) on a semiconductor substrate 10. While descriptions are not presented, the upper surface of the semiconductor substrate 10 is provided with a semiconductor element such as a transistor, an interlayer insulating film covering thereof, a contact for joining the semiconductor element with the interconnect layer, and according to the circumstances, an interconnect layer and the like. An insulating film 202 (second insulating film) is formed on the insulating film 201, and a recessed section 111 is formed on the insulating film 202.

Figure 8A:
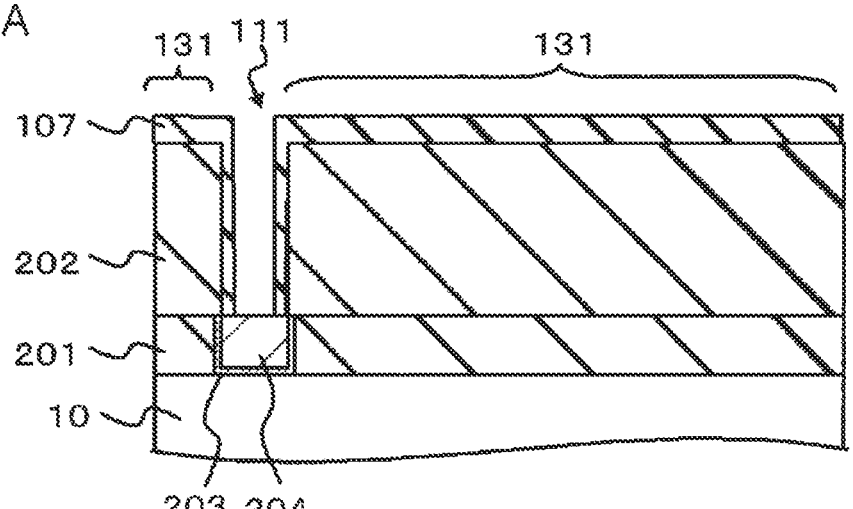
FIGS. 8A to 8C are cross-sectional views, illustrating an example of a process for manufacturing a semiconductor device according to third embodiment.

Next, as shown in FIG. 8A, the film 107 serving as the barrier metal film and the cover metal film is formed over the insulating film 202 and the seed film 204. The film 107 serving as the barrier metal film and the cover metal film may be formed by, for example, a physical vapor deposition such as sputter deposition process, a chemically-oriented vapor deposition process such as CVD process and ALD process, a liquid phase deposition process, or a supercritical fluid growth process. However, the deposition under the condition for preventing a formation of thicker film at the aperture of the recessed section 111 may be preferably selected.

Subsequently, a selective etching process is carried out to remove the portion of the film 107 serving as the barrier metal film and the cover metal film on the bottom section of the recessed section 111, thereby exposing the seed film 204. In this case, the portion of the film 107 serving as the barrier metal film and the cover metal film disposed on the bottom section of the recessed section 111 is removed by accelerating ions travelling toward the bottom section of the recessed section 111 from a plasma through a technique of, for example, applying RF bias or the like, so that the portions of the film 107 serving as the barrier metal film and the cover metal film are remained on the side surface sections of the recessed section 111 and the regions other than the recessed section 111 over the insulating film 202 (field section 131).

In the present embodiment, the film 107 serving as the barrier metal film and the cover metal film is an electroconductive film, which has poor and lower plating deposition ability than the seed film 204, and also has a function as a barrier metal film, while being provided with improved adhesiveness with Cu. This allows providing improved reliability of the semiconductor device. Further, the presence of the film 107 serving as the barrier metal film and the cover metal film allows an electric current flowing through the recessed section 111 during the electrolytic plating process.

In the present embodiment, a material, which causes no diffusion in Cu at a temperature of around 100 to 400 degrees C., is preferable for the material of the film 107 serving as the barrier metal film and the cover metal film, and for example, a material mainly containing ruthenium (Ru) is typically employed. In addition, the film 107 serving as the barrier metal film and the cover metal film may be formed on, for example, the field section 131 over the insulating film 202 at a thickness of 0.5 to 10 nm, and on the side surfaces of the recessed section 111 at a thickness of 0.5 to 5 nm.

Figure 8B:
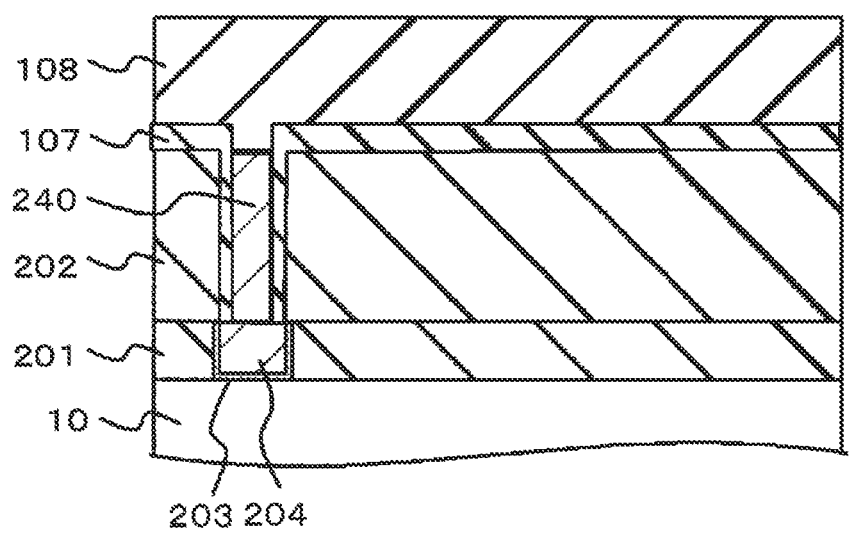
Figure 8C:
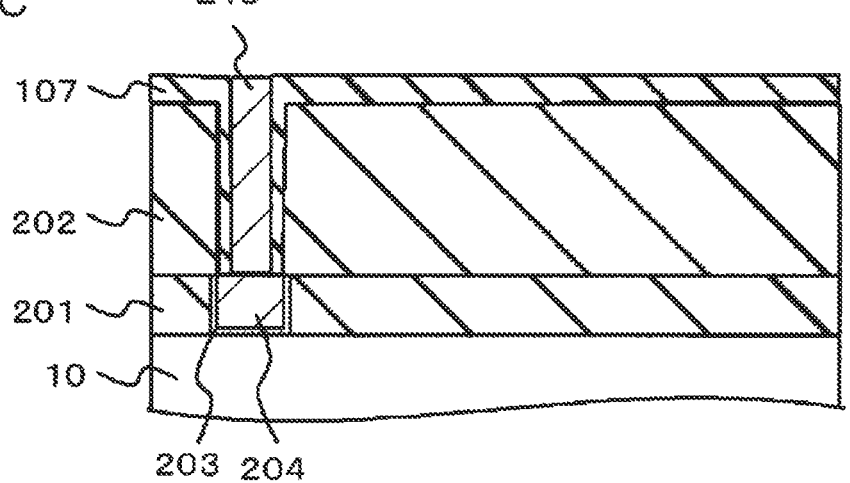

In next, similarly as in the above-described embodiment described in reference to FIGS. 2B and 2C, first of all, a plating process with an electrolytic plating solution 108 is conducted by utilizing the seed film 204 exposed over the bottom section of the recessed section 111 as a seed to carry out the growth of the plated film 240 (FIG. 8B). This achieves a selective growth of the plated film 240 on the seed film 204 from the bottom section of the recessed section 111, thereby achieving the plated film 240 being buried in the recessed section 111 (FIG. 8C).

The subsequent process operations are similar to that in the process for forming the ordinary damascene interconnect. First of all, a thermal processing is conducted to allow a unification of the seed film 204 and the plated film 240 by recrystallization. Then, the film 107 serving as the barrier metal film and the cover metal film and the plated film 240 are selectively removed by means of a CMP process to planarize the surface, thereby forming a Cu interconnect, eventually providing a semiconductor device.

The advantageous effects of the present embodiment will be described. Since the film 107 serving as the barrier metal film and the cover metal film is employed in the present embodiment, simplified deposition operation can be achieved, as compared with the process for separately forming the barrier metal film and the cover metal film in separate operations. Other advantageous effects are similar to that in the above-described first and second embodiment.

While the configuration of employing Ru for the material of the film 107 serving as the barrier metal film and the cover metal film is described in the above-described embodiment, the material is not limited thereto. For example, materials other than Ru, more specifically, a material having tantalum (Ta) stacked on tantalum nitride (TaN), or titanium nitride (TiN), tungsten nitride (WN) or the like may be employed. In addition to above, when a material that does not cause a diffusion in Cu is employed for the film 107 serving as the barrier metal film and the cover metal film, the constituent element of the film 107 serving as the barrier metal film and the cover metal film does not cause a diffusion into the seed film 204 and the plated film 240 by the thermal processing.

Fourth Embodiment

Fourth embodiment illustrates a semiconductor device having a dual damascene structure.

An example of a process for manufacturing a semiconductor device according to fourth embodiment will be described in reference to FIGS. 9A to 9C, FIGS. 10A to 10C and FIGS. 11A to 11C.

Figure 9A:
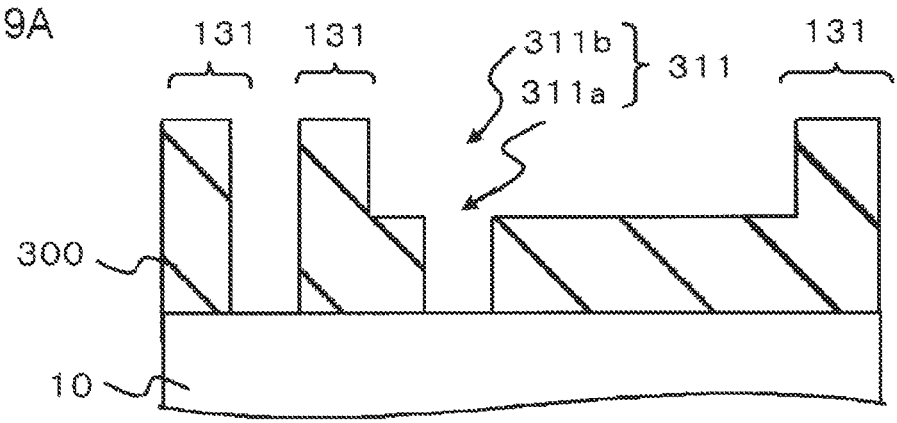
FIGS. 9A to 9C are cross-sectional views, illustrating an example of a process for manufacturing a semiconductor device according to fourth embodiment.

As shown in FIG. 9A, an insulating film 300 is formed on a semiconductor substrate 10, and recessed sections 311 are formed in the insulating film 300. The recessed section 311 is composed of a via hole 311a and an interconnect trench 311b in the dual damascene structure.

The via hole 311a may preferably have aspect ratio of equal to or lower than 1.5, and more preferably equal to or lower than 1. Since the growth by means of the ordinary plating process substantially isotropically proceeds, the optimization of the process may be achieved by suitably controlling the additives to the electrolytic plating liquid or the process conditions for the electrolytic plating process. On the contrary, the configuration of providing the via hole 311a having aspect ratio of equal to or lower than 1.5 or more preferably equal to or lower than 1 can inhibits an unwanted closure of an aperture of the via hole 311a by the plating deposition from the bottom section of the interconnect trench 311b before the plated film grown from the bottom section of the via hole 311a reaches to the aperture of the via hole 311a, even if the plating process for growing the plated film from the bottom section of the interconnect trench 311b substantially isotropically proceeds. Further, the configuration of providing the via hole 311a having aspect ratio of equal to or lower than 1 allows achieving reduced process time for the plating deposition, while obtaining a sufficient effect for inhibiting the creation of void, even if the cover metal film 106 is formed only in a section of the inner wall of the via hole 311a.

When a structural body containing Cu is present in a location associated to the bottom surface of the via hole 311a formed in the insulating film 300 on the semiconductor substrate 10, the structural body containing Cu may be exposed in the bottom section of the via hole 311a and the plating deposition may be achieved by utilizing the exposed structural body as a seed, similarly as in the above-described second embodiment and third embodiment.

Figure 9B:
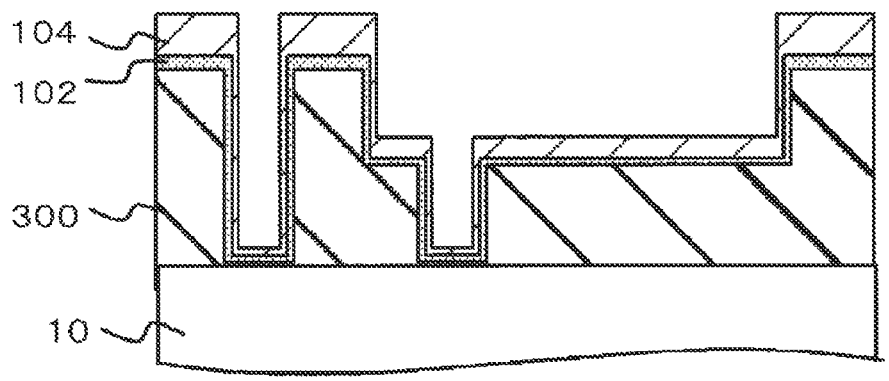

As shown in FIG. 9B, the barrier metal film 102 and the seed film 104 are sequentially formed over the insulating film 300 and the recessed section 311. The barrier metal film 102 and the seed film 104 may be formed by, for example, a physical vapor deposition such as sputter deposition process, a chemically-oriented vapor deposition process such as CVD process and ALD process, a liquid phase deposition process, or a supercritical fluid growth process. However, the deposition under the condition for preventing a formation of thicker film at the aperture of the recessed section 311 may be preferably selected.

Figure 9C:
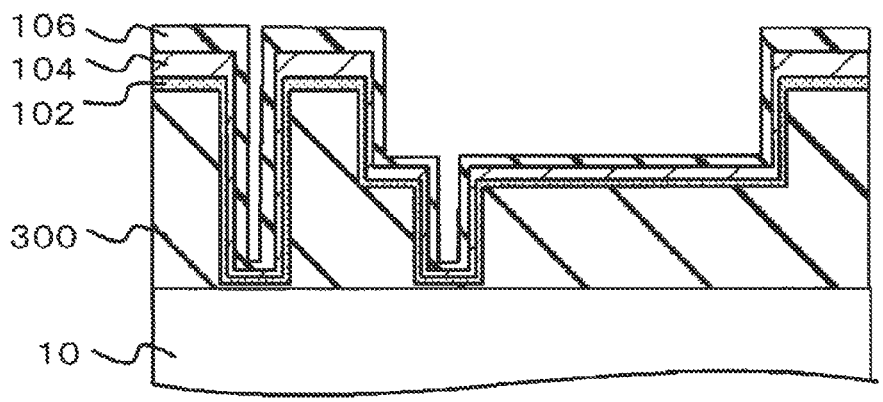
Figure 10A:
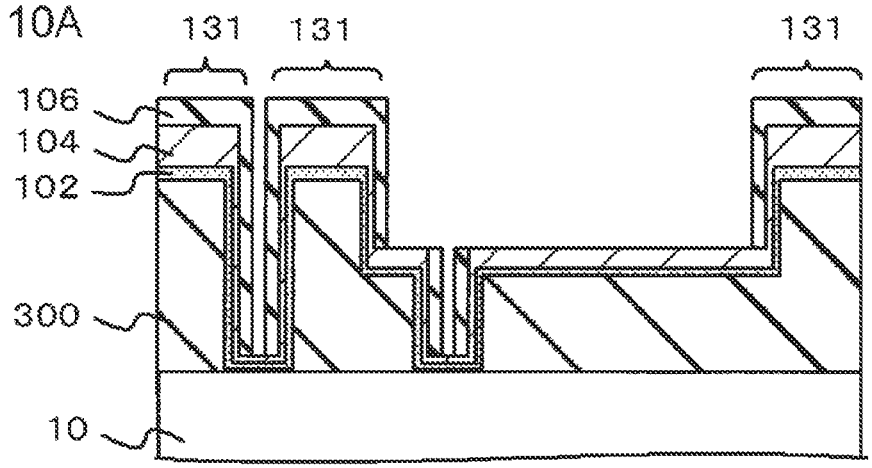
FIGS. 10A to 10C are cross-sectional views, illustrating the example of the process for manufacturing the semiconductor device according to fourth embodiment.

As shown in FIG. 9C, the cover metal film 106 is formed on the seed film 104. The cover metal film 106 is formed on the bottom section and on the side surface sections of the recessed section 311 by employing, for example, an ionized spatter deposition process, As shown in FIG. 10A, a selective etching process is carried out to remove the portion of the cover metal film 106 disposed on the bottom section of the via hole 311a and the portion of the cover metal film 106 disposed on the bottom section of the interconnect trench 311b, respectively, to expose the portions of the seed film 104 in the respective bottom sections. In such case, for example, removing the portion of the cover metal film 106 on the bottom section of the recessed section 311 by accelerating ions travelling toward the bottom section of the recessed section 311 from a plasma through a technique of applying RF bias or the like, so that the portions of the cover metal film 106 are remained on the side surface sections of the recessed section 311 and the upper surface of the portions of the seed film 104 formed in regions other than the recessed section 311 over the insulating film 300 (field section 131).

In the present embodiment, for example, a material having Ta stacked on TaN may be employed for the barrier metal film 102. Further, the barrier metal film 102 is formed at a thickness of 1 to 20 nm.

In the present embodiment, Cu, for example, is employed as a material for the seed film 104. Further, the seed film 104 is formed at a thickness of 10 to 100 nm.

In the present embodiment, Ti, for example, is employed as a material for the cover metal film 106. Further, the cover metal film 106 may be formed on, for example, the field section 131 (in regions except the via hole 311a, respective side surface sections of the interconnect trench 311b, and the recessed section 311 on the insulating film 300) over the insulating film 300 at a thickness of 0.5 to 10 nm, and on the side surfaces of the recessed section 311 at a thickness of 0.5 to 5 nm.

Figure 10B:
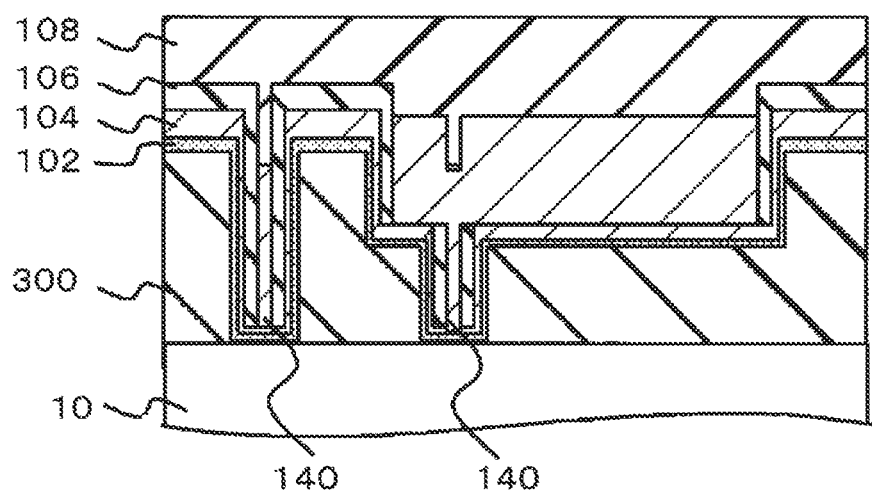
Figure 10C:
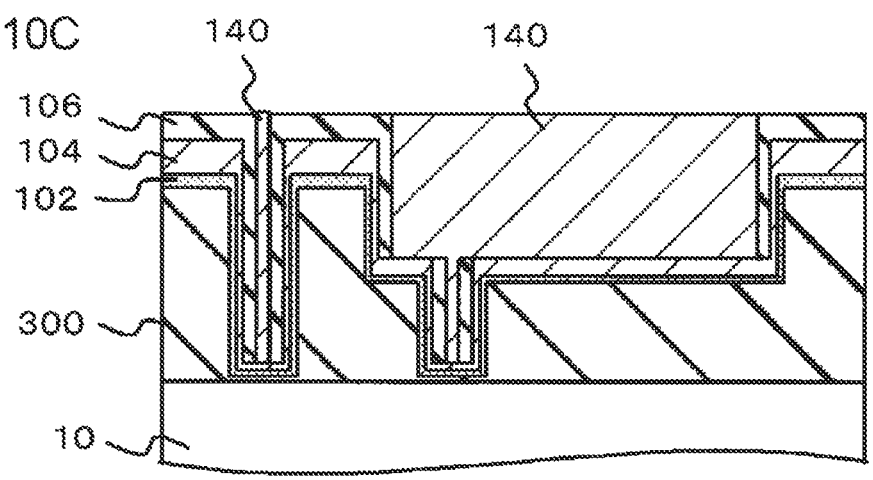

As shown in FIG. 10B, a plating process with an electrolytic plating solution 108 is conducted by utilizing the seed film 104 exposed over the bottom sections of the via hole 311a and the interconnect trench 311b as a seed to carry out the growth of the plated film 140. This achieves a selective growth of the plated film 140 on the seed film 104 from the bottom sections of the via hole 311a and the interconnect trench 311b as shown in FIG. 10C, thereby achieving the plated film 240 being buried in the recessed section 311.

Then, processes similar to the first thermal processing, the CMP processing and the second thermal processing as described the above-described first embodiment are carried out. Brief description thereof will be presented as follows.

First of all, the first thermal processing is carried out. This allows a unification of the seed film 104 and the plated film 140 by recrystallization to form a plated film 140a.

Figure 11A:
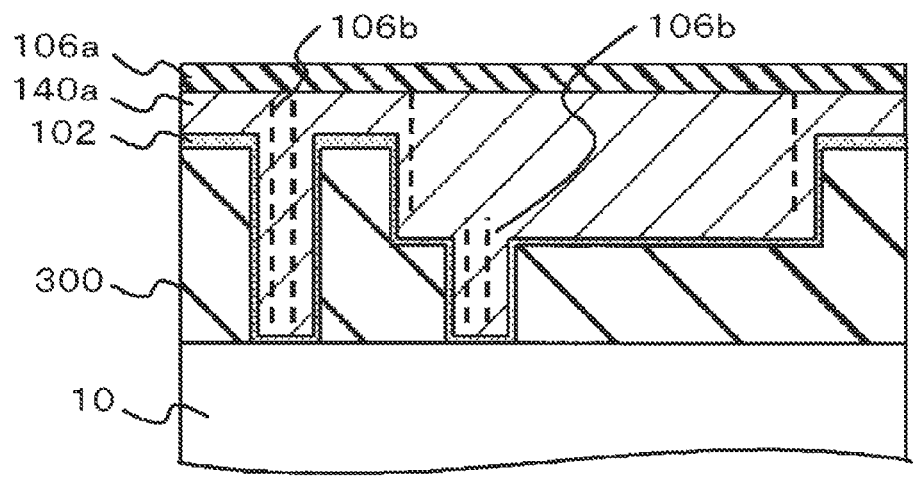
FIGS. 11A to 11C are cross-sectional views, illustrating the example of the process for manufacturing the semiconductor device according to fourth embodiment.

In addition, Ti contained in the cover metal film 106 diffuses in the plated film 140a to form a cap film 106a on the surface of the plated film 140a (see FIG. 11A). Further, a region 106b containing a chemical element constituting the cover metal film 106 at higher concentration than other chemical elements in the peripheral areas is formed. In the present embodiment, the region 106b has a Ti concentration that is higher than the Ti concentration of the peripheral sections thereof.

Figure 11B:
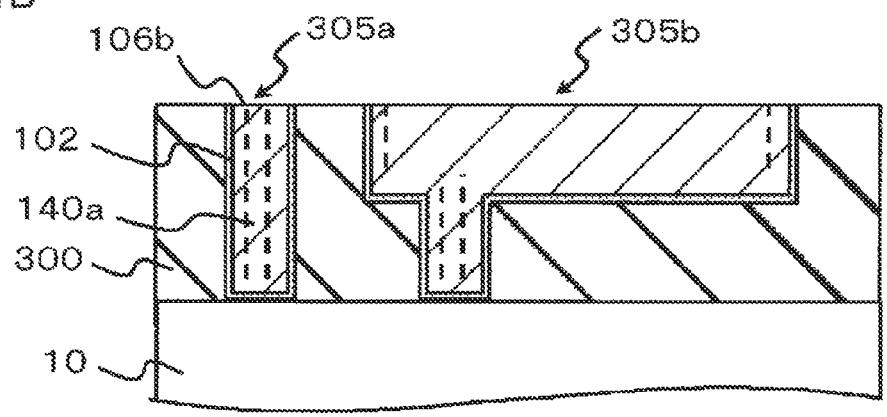

As shown in FIG. 11B, the cap film 106a, the plated film 140a and the barrier metal film 102 are selectively removed by means of a CMP process to planarize the surface, thereby leaving the plated film 140a only in the concave section 111. This provides a via 305a and a Cu interconnect 105.

Figure 11C:
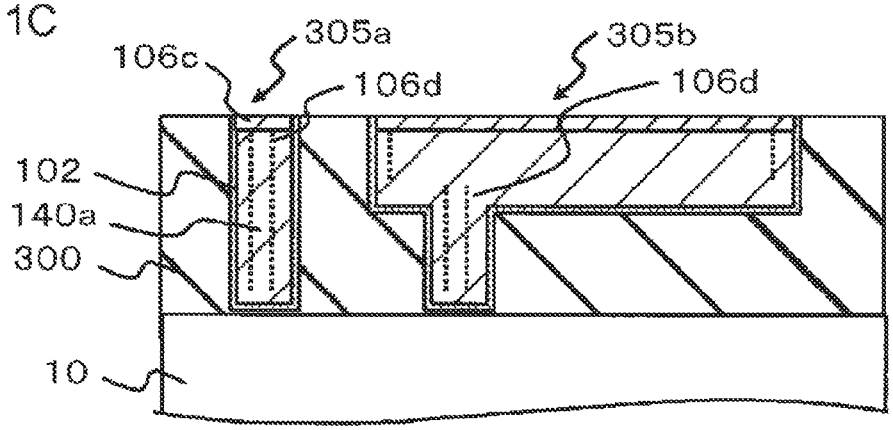

Next, the second thermal processing is conducted. Atomic element such as Ti originated in the cover metal film 106 on the surface of the Cu interconnect 105 and remained at a very small amount in the Cu interconnect 105 is segregated in the surfaces of the via 305a and the Cu interconnect 305b to form a cap film 106c (FIG. 11C). In addition, Ti in the cover metal film 106 is capable of more uniformly diffusing. As shown in FIG. 11C, the concentration of atomic element constituting the cover metal film 106 in the region 106b is further reduced to form a region 106d. In addition to above, the region 106d is a region having higher concentration of atomic element constituting the cover metal film 106 than atomic elements in the peripheral regions.

In the present embodiment, the concentrations of metallic elements except Cu are the highest in a region of the electric conductor defined with a distance from the bottom sections of the via 305a and the Cu interconnect 305b toward a top surface thereof of equal to or larger than 1 nm and equal to or lower than 20 nm.

Advantageous effects in the present embodiment will be described. Since the semiconductor device is of the dual damascene structure in the present embodiment, more simple process operations are available, as compared with a single damascene structure. Other advantageous effects are similar to that in the above-described first embodiment.

Fifth Embodiment

Fifth embodiment illustrates a semiconductor device having a dual damascene structure. Descriptions will be made in reference to FIGS. 12A to 12C, FIGS. 13A to 13C and FIG. 14. While the plating process is conducted in the condition that the portions of the seed film 104 are exposed at the bottom sections of the via hole 311a and the interconnect trench 311b fourth embodiment, the portions of the cover metal film 106 in the region except the aperture of the via hole 311a in the bottom section of the interconnect trench 311b are not stripped in the present embodiment, and the plating process is conducted in the condition that the portion of the seed film 104 in the bottom section of the via hole 311a is exposed.

An example of a process for manufacturing a semiconductor device according to fifth embodiment will be described in reference to FIGS. 12A to 12C, FIGS. 13A to 13C and FIG. 14.

First of all, as described above, similarly as illustrated in FIGS. 9A to 9C and FIG. 10A, the recessed section 311 is formed in the insulating film 300, and the barrier metal film 102, the seed film 104 and the cover metal film 106 are sequentially formed, and then the portion of the seed film 104 is exposed in the bottom section of the via hole 311a. In addition to above, the barrier metal film 102, the seed film 104 and the cover metal film 106 are sequentially deposited in the region of the bottom section of the interconnect trench 311b except the aperture of the via hole 311a.

In the present embodiment, for example, a material having Ta stacked on TaN may be employed for the barrier metal film 102.

Further, the barrier metal film 102 is formed at a thickness of 1 to 20 nm.

In the present embodiment, Cu, for example, is employed as a material for the seed film 104. Further, the seed film 104 is formed at a thickness of 10 to 100 nm.

Figure 12A:
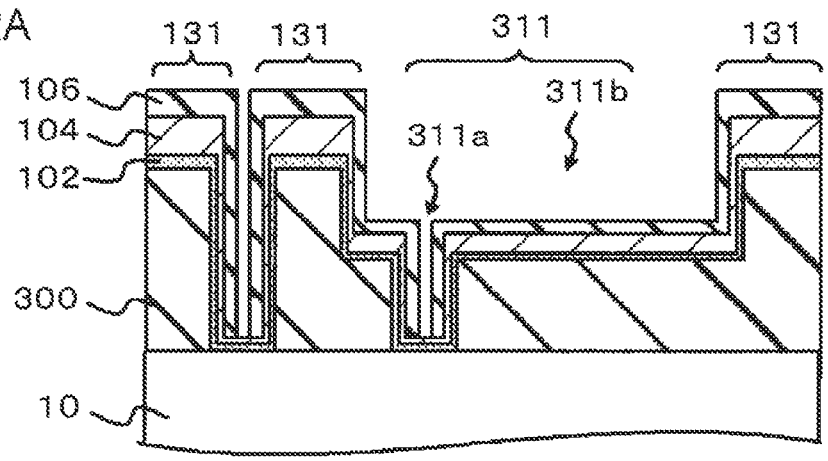
FIGS. 12A to 12C are cross-sectional views, illustrating an example of a process for manufacturing a semiconductor device according to fifth embodiment.

In the present embodiment, Ru, for example, is employed as a material for the cover metal film 106. Further, the cover metal film 106 may be formed on, for example, the field section 131 (in regions except the via hole 311a, respective side surface sections of the interconnect trench 311b, and the recessed section 311 on the insulating film 300) over the insulating film 300 at a thickness of 0.5 to 10 nm, and on the side surfaces of the recessed section 311 at a thickness of 0.5 to 5 nm (FIG. 12A).

Figure 12B:
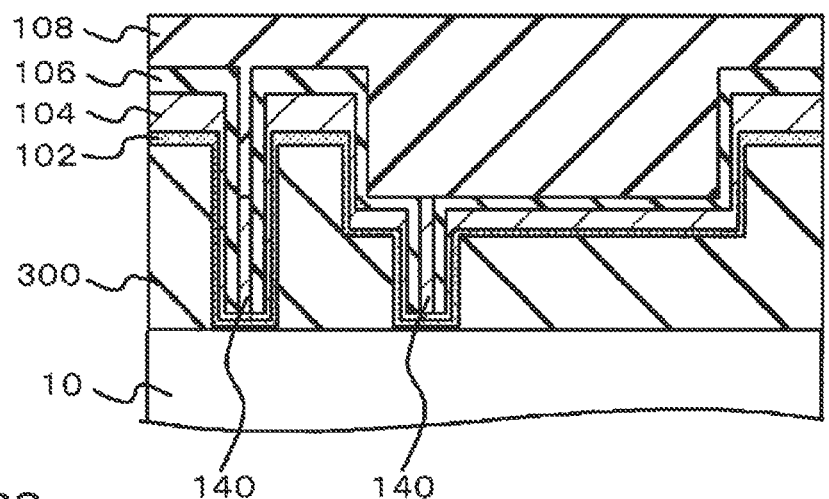
Figure 12C:
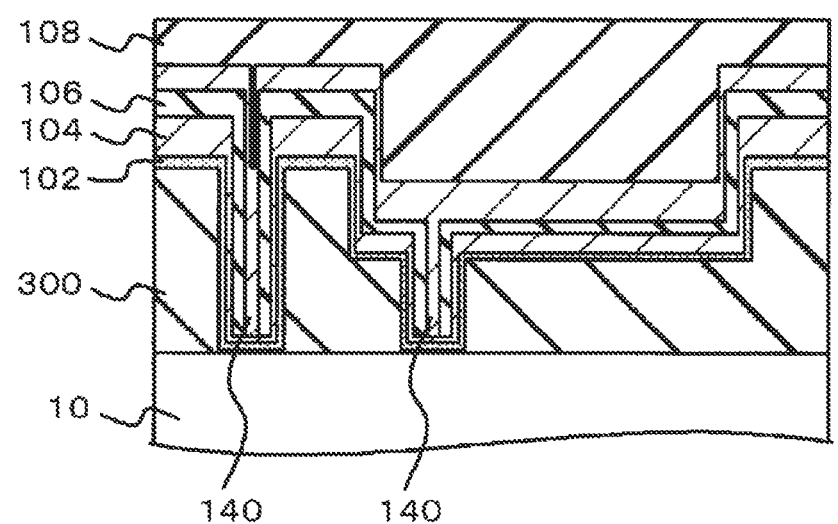

As shown in FIG. 12B, a plating process with an electrolytic plating solution 108 is conducted by utilizing the seed film 104 exposed over the bottom section of the via hole 311a as a seed to carry out the growth of the plated film 140. This achieves a selective growth of the plated film 140 on the seed film 104 from the bottom section of the via hole 311a as shown in FIGS. 12B and 12C, thereby achieving the plated film 240 being buried in the recessed section 311.

In such case, the electric current for the plating process is controlled to have an electric current density within a range of from about 0.1 A/dm$^2$ to about 1 A/dm$^2$ until the via hole 311a is filled as shown in FIG. 12B, and after the via hole 311a is filled, the electric current for the plating process is controlled to have an electric current density within a range of from about 1 A/dm² to about 10 A/dm². Commonly, the plating deposition of Ti (cover metal film 106) requires higher voltage, as compared with that of Cu (seed film 104). Therefore, lower voltage of about 0.1 A/dm² to 1 A/dm² is selected as the electric current for the plating process to achieve the deposition only in the bottom section of the via hole 311a. Then, the voltage is increased up to a higher voltage ranging from about 1 A/dm² to about 10 A/dm², so that the plating deposition is also created on Ti.

Then, processes similar to the first thermal processing, the CMP processing and the second thermal processing as described the above-described first embodiment are carried out. Brief description thereof will be presented as follows.

First of all, the first thermal processing is carried out.

This allows a unification of the seed film 104 and the plated film 140 by recrystallization to form a plated film 140a. In addition, Ti contained in the cover metal film 106 diffuses in the plated film 140a to form a cap film 106a on the surface of the plated film 140a (see FIG. 13B). Further, a region 106b containing a chemical element constituting the cover metal film 106 at higher concentration than other chemical elements in the peripheral areas is formed. In the present embodiment, the region 106b has a Ti concentration that is higher than the Ti concentration of the peripheral sections thereof.

Figure 13A:
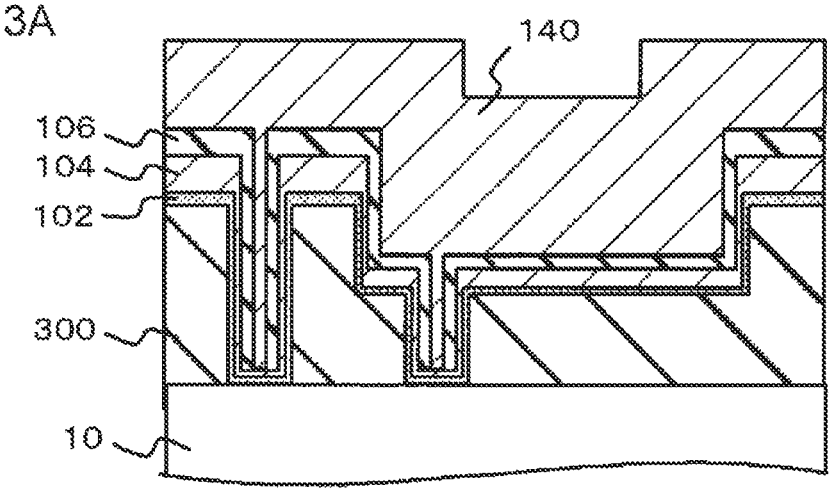
FIGS. 13A to 13C are cross-sectional views, illustrating the example of the process for manufacturing the semiconductor device according to fifth embodiment.
Figure 13B:
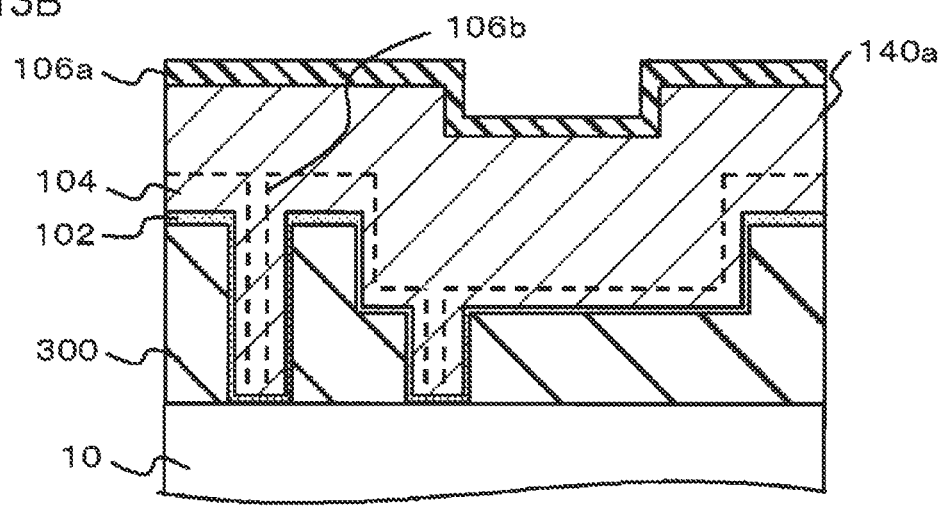
Figure 13C:
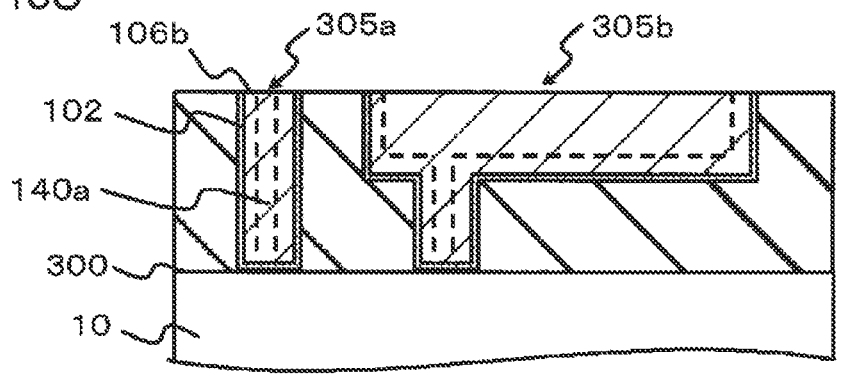

As shown in FIG. 13C, the cap film 106a, the plated film 140a and the barrier metal film 102 are selectively removed by means of a CMP process to planarize the surface, thereby leaving the plated film 140a only in the concave section 111. This provides a via 305a and a Cu interconnect 105.

Figure 14:
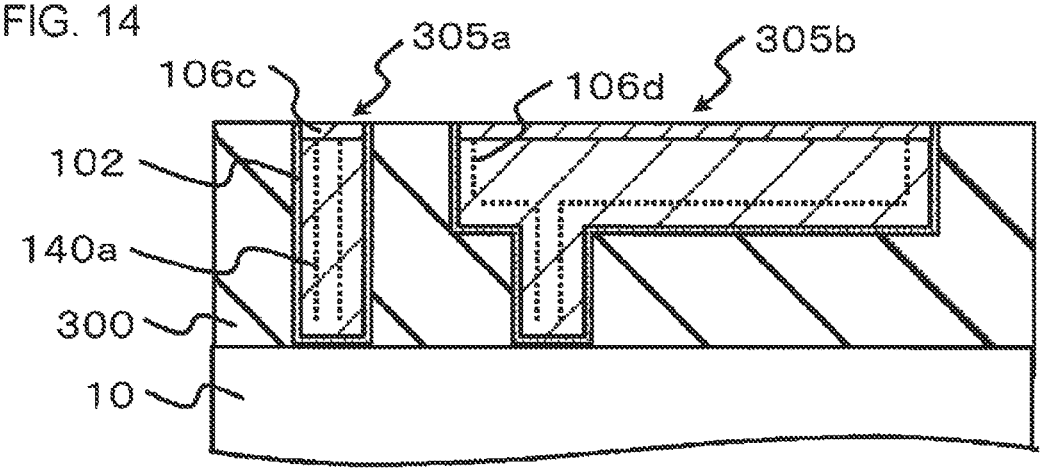
FIG. 14 is a cross-sectional view, illustrating the example of the process for manufacturing the semiconductor device according to fifth embodiment.

Next, the second thermal processing is conducted. This allows that atomic element such as Ti originated in the cover metal film 106 on the surface of the Cu interconnect 105 and remained at a very small amount in the Cu interconnect 105 is segregated in the surfaces of the via 305a and the Cu interconnect 305b to form a cap film 106c (FIG. 14). In addition, Ti in the cover metal film 106 is capable of more uniformly diffusing. As shown in FIG. 14, the concentration of atomic element constituting the cover metal film 106 in the region 106b is further reduced to form a region 106d. In addition to above, the region 106d is a region having higher concentration of atomic element constituting the cover metal film 106 than atomic elements in the peripheral regions.

Advantageous effects in the present embodiment will be described.

Since the plating deposition in the via hole 311a is more preferentially achieved than in the interconnect trench 311b in the present embodiment, the generation of voids at the aperture of the via hole 311a can be further inhibited. Further, since the via hole 311a is filled to provide reduced aspect ratio, the generation of voids can be inhibited, even if the bottom up performance is poor with the fine pattern. Other advantageous effects are similar to that in the above-described first embodiment.

It is intended that the semiconductor device according to the present invention is not limited to the above-described embodiment, and various modifications thereof may also available.

While the above-described embodiment illustrates that the recessed section is formed in the insulating film on the semiconductor substrate 10, an alternative configuration may be that a recessed section is formed in one side of the substrate without forming any insulating film, and then an insulating film is formed over such one side of the substrate and the side surfaces of the recessed section by coating thereof with an insulator material. In this case, similarly as described in the above-described embodiment, the inside of the recessed section may also be plugged with the plated film.

Sixth Embodiment

While first embodiment illustrates the semiconductor device having the damascene interconnect structure, sixth embodiment illustrates a semiconductor device having through silicon via (TSV) structure.

In the present embodiment, a semiconductor device includes a substrate 500 and a through silicon via 505 buried in the substrate 500, and the through silicon via 505 has a point that represent the highest concentration of a metallic element except Cu in a region defined by a distance from the side surface section of the through silicon via 505 toward a central section of equal to or larger than 1 nm and equal to or lower than 20 nm, and in addition, an insulating film 502 is provided between the substrate 500 and the side surface section of the through silicon via 505.

While descriptions are not presented, the semiconductor substrate 500 is provided with a semiconductor element such as a transistor and a multiple-layered interconnect layer having an interlayer film in the present embodiment.

An example of a process for manufacturing a semiconductor device according to sixth embodiment will be described in reference to FIGS. 15A to 15C, FIGS. 16A to 16C and FIGS. 17A to 17C.

In a method for manufacturing a semiconductor device of the present embodiment, an operation of preparing a substrate 500 having a recessed section 511 and also having a seed film 104 exposed on the bottom section of the recessed section 511 includes an operation of forming the recessed section 511 in the substrate 500, an operation of forming an insulating film 502 in the recessed section 511, and an operation of forming a seed film 104 on the insulating film 502 in the recessed section 511. Detailed description will be made below.

Figure 15A:
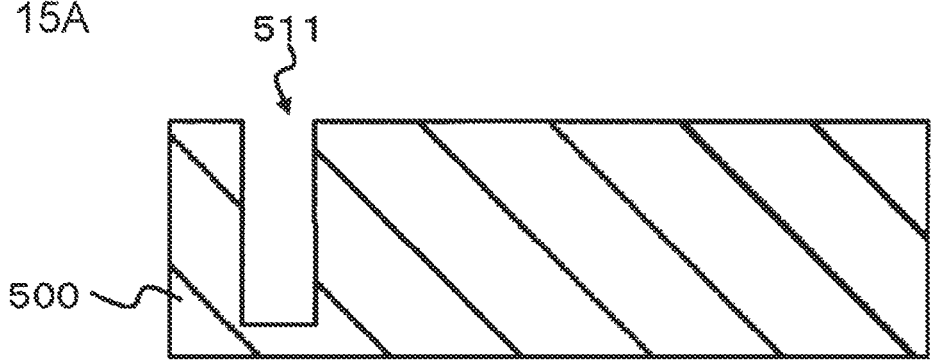
FIGS. 15A to 15C are cross-sectional views, illustrating an example of a process for manufacturing a semiconductor device according to sixth embodiment.

As shown in FIG. 15A, the recessed section 511 is formed in a surface in one side of the substrate 500. Subsequently, the insulating film 502 is formed in the recessed section 511. The insulating film 502 is composed of an insulator material.

Figure 15B:
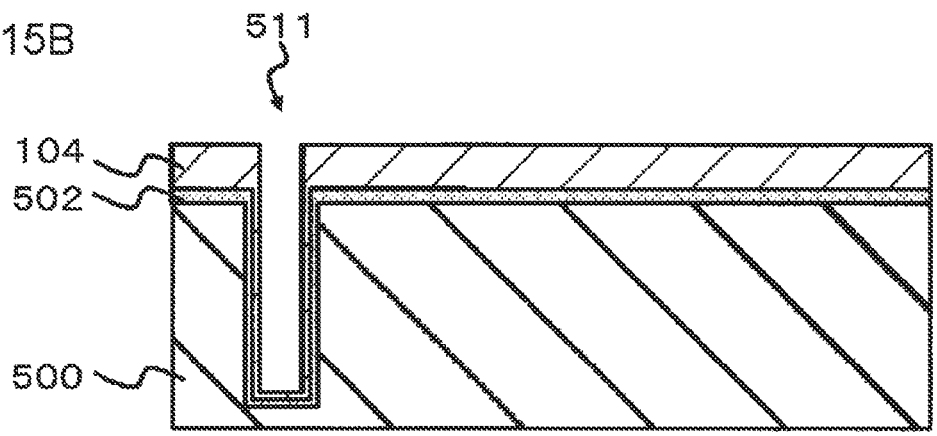

As shown in FIG. 15B, the seed film 104 is sequentially formed on the insulating film 502 disposed on the substrate 500 and the recessed section 511. The insulating film 502 and the seed film 104 may be formed by, for example, a physical vapor deposition such as sputter deposition process, a chemically-oriented vapor deposition process such as CVD process and ALD process, a liquid phase deposition process, or a supercritical fluid growth process. However, the deposition under the condition for preventing a formation of thicker film at the aperture of the recessed section 511 may be preferably selected. Further, a barrier metal film may be deposited after the deposition of the insulating film 502 and before the deposition of the seed film 104.

Figure 15C:
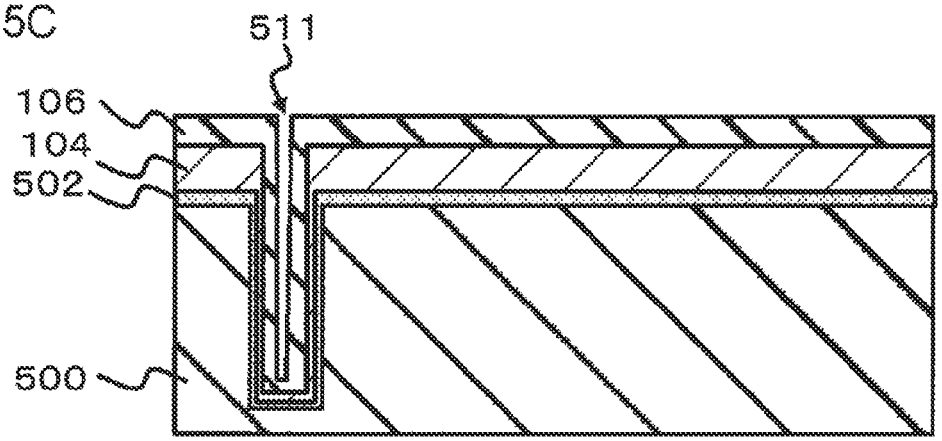

As shown in FIG. 15C, the cover metal film 106 is formed on the seed film 104. The cover metal film 106 is, for example, formed over the bottom section and the side surface sections of the recessed section 511 and over the upper surface of the insulating film 502 by employing an ionized sputter deposition process. In the present embodiment, the cover metal film 106 is an electroconductive film having lower plating deposition ability than the seed film 204.

Figure 16A:
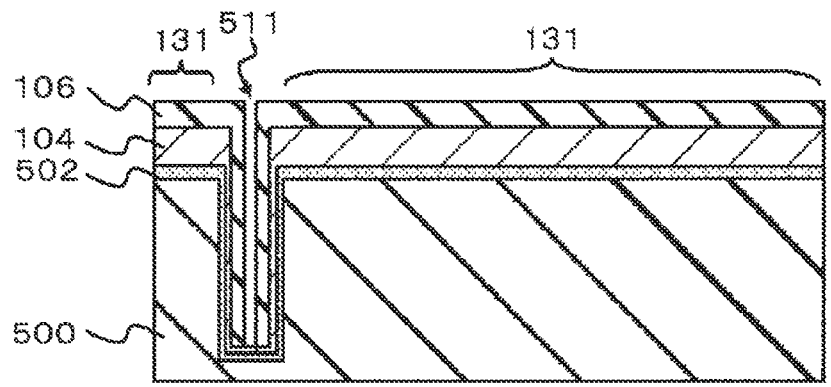
FIGS. 16A to 16C are cross-sectional views, illustrating the example of the process for manufacturing the semiconductor device according to sixth embodiment.

As shown in FIG. 16A, a selective etching process is carried out to remove the portion of the cover metal film 106 on the bottom section of the recessed section 111, thereby exposing the seed film 104. In this case, the cover metal film 106 disposed on the bottom section of the recessed section 511 is removed by accelerating ions travelling toward the bottom section of the recessed section 511 from a plasma through a technique of, for example, applying RF bias or the like, so that the portions of the cover metal film 106 are remained on the side surface sections of the recessed section 511 and the regions other than the recessed section 511 over the substrate 500 (field section 131).

Figure 16B:
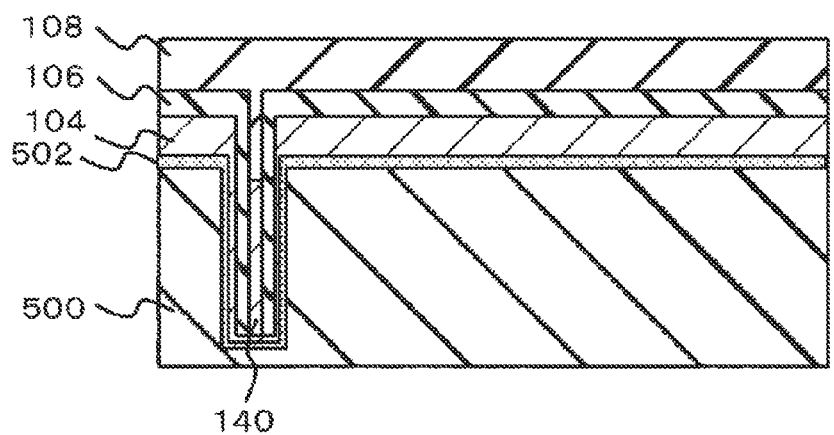
Figure 16C:
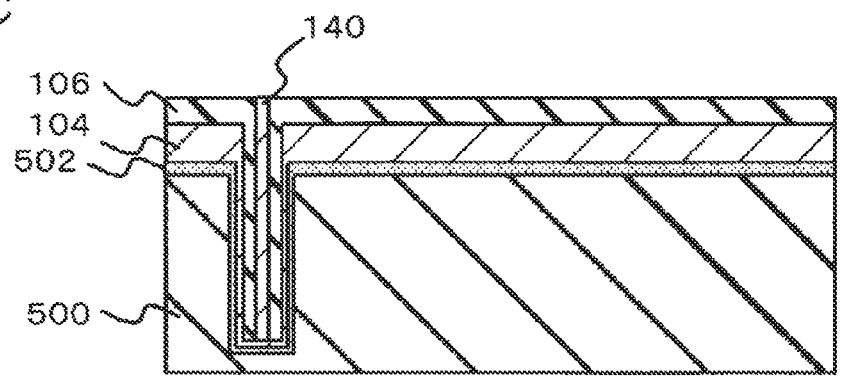

Next, as shown in FIG. 16B, a plating process with an electrolytic plating solution 108 is conducted by utilizing the seed film 104 exposed over the bottom section of the recessed section 511 as a seed to carry out the growth of the plated film 140. This achieves, as shown in FIG. 16C a selective growth of the plated film 140 on the seed film 104 from the bottom section of the recessed section 511, thereby achieving the plated film 140 being buried in the recessed section 511.

Process conditions for the plating process may be similar as employed in the above-described embodiment.

Next, the first thermal processing is carried out. This allows a unification of the seed film 104 and the plated film 140 by recrystallization to form a plated film 140a. In addition, Ti contained in the cover metal film 106 diffuses in the plated film 140a to form a cap film 106a on the surface of the plated film 140a (see FIG. 17A). Further, a region 106b containing a chemical element constituting the cover metal film 106 at higher concentration than other chemical elements in the peripheral areas is formed. In the present embodiment, the region 106b has a Ti concentration that is higher than the Ti concentration of the peripheral sections thereof.

Figure 17A:
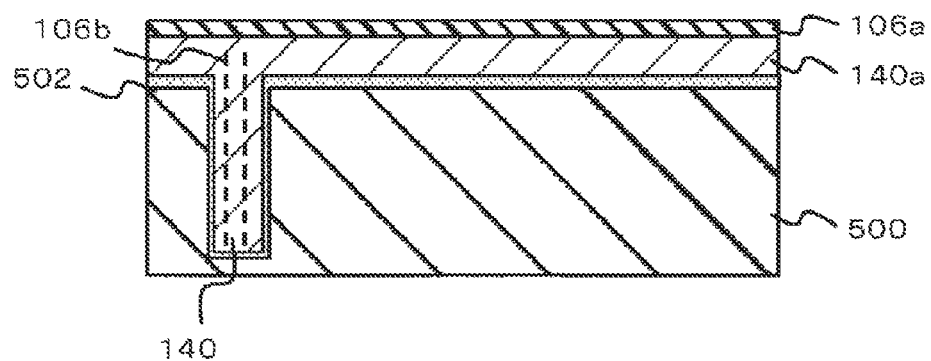
FIGS. 17A to 17C are cross-sectional views, illustrating the example of the process for manufacturing the semiconductor device according to sixth embodiment.
Figure 17B:
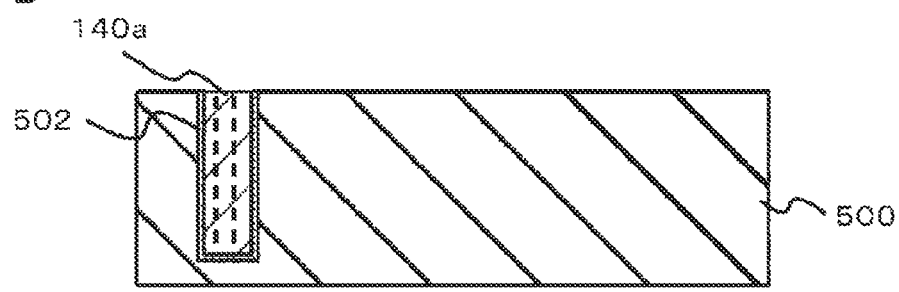

Subsequently, as shown in FIG. 17B, the cap film 106a, the plated film 140a and the insulating film 502 are selectively removed by means of a CMP process to planarize the surface, thereby leaving the plated film 140a only in the concave section 511.

Figure 17C:
Figure 21A:
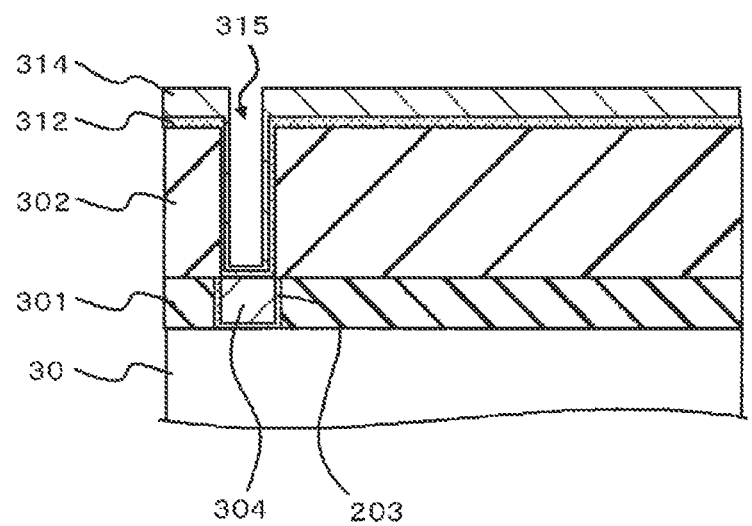
FIGS. 21A to 21C are cross-sectional views, useful in describing an operation of a fill of the inside of a recessed section by means of a conventional Cu deposition process.
Figure 21B:
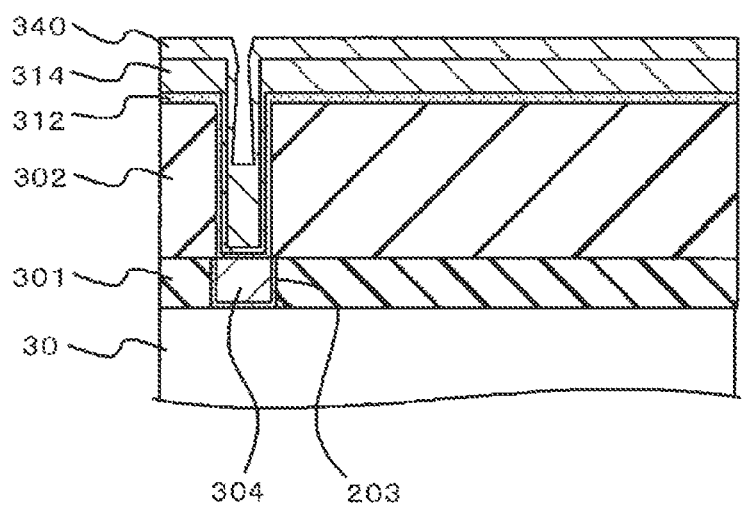
Figure 21C:
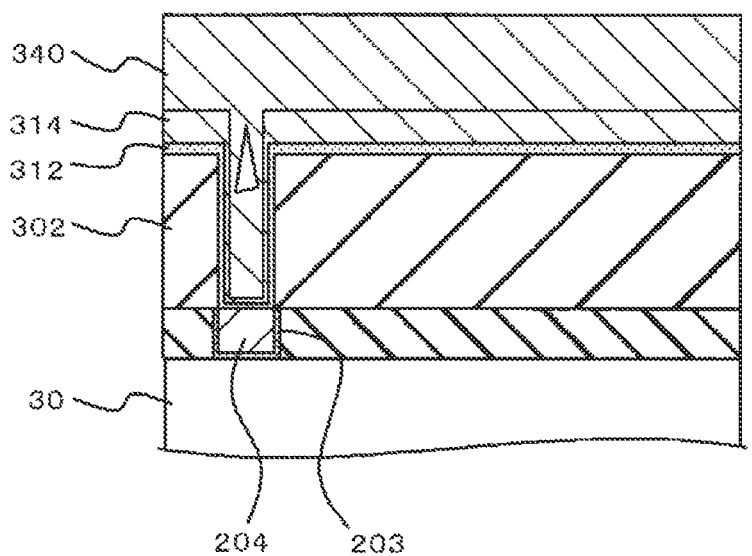
Figure 22:
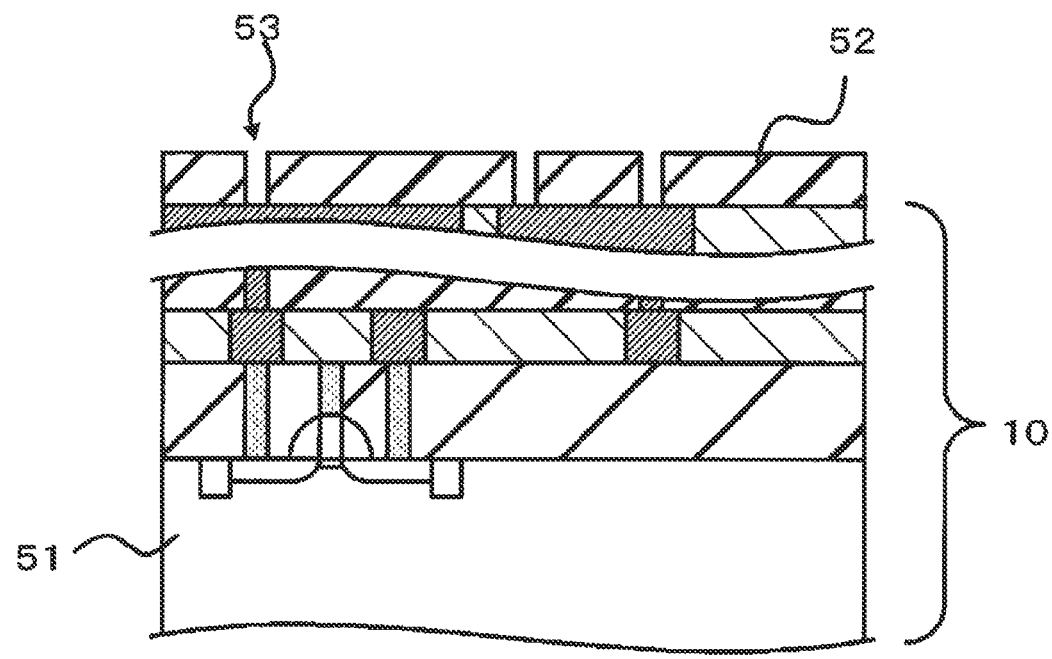
FIG. 22 is a cross-sectional view, illustrating an example of a conventional semiconductor device.
Figure 23A:
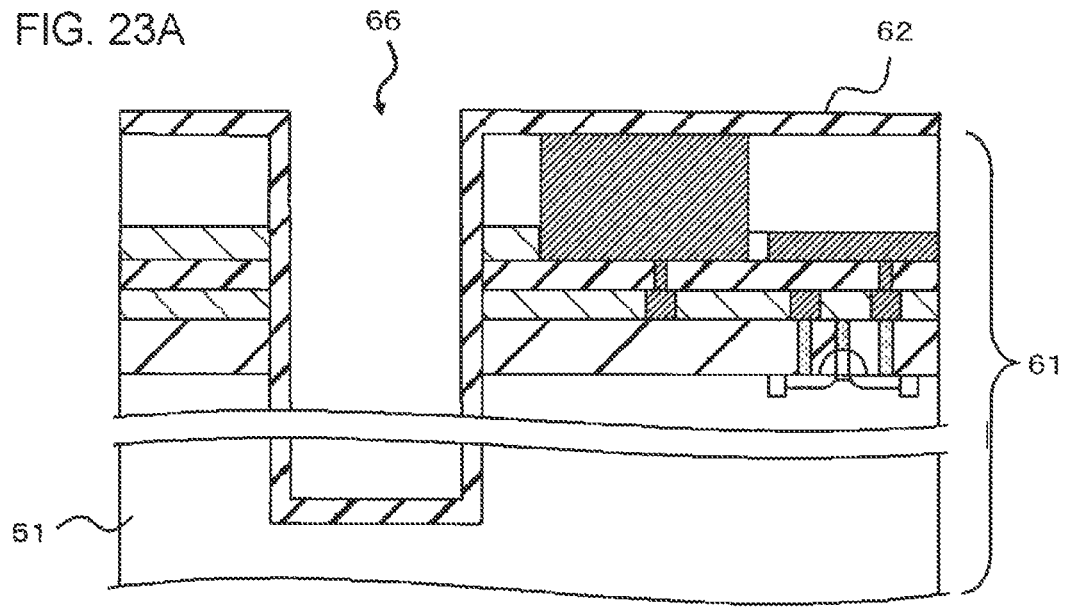
FIGS. 23A and 23B are cross-sectional views, illustrating an example of a conventional semiconductor device.
Figure 23B:
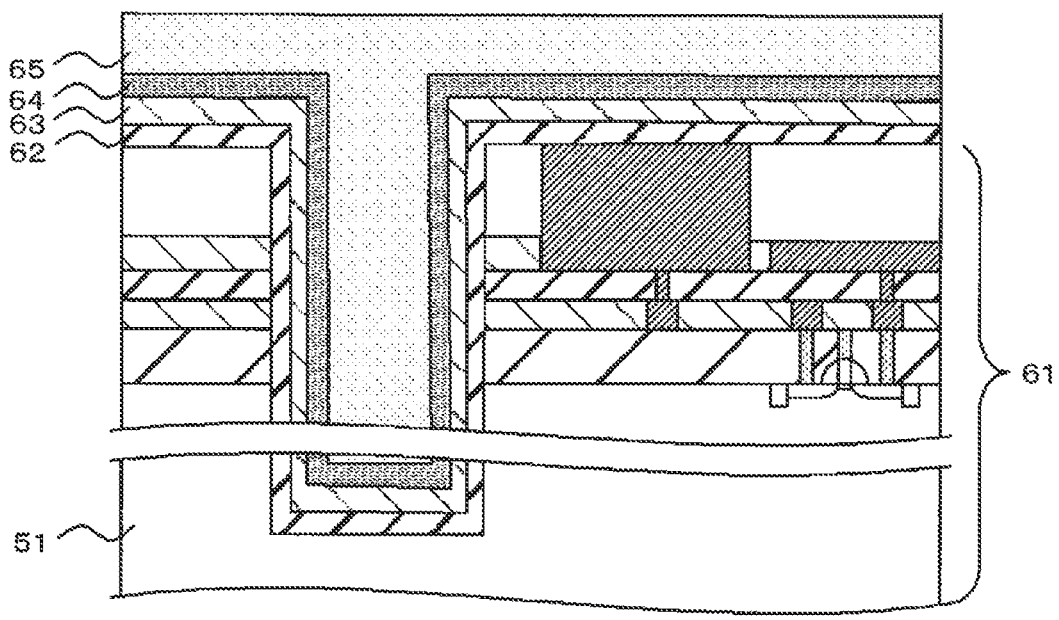

Further, as shown in FIG. 17C, the substrate 500 is selectively removed by means of a CMP process from the surface of the substrate 500 in the side opposite to the surface having the recessed section 511 to form a through silicon via 505. The semiconductor device having the TSV structure is thus obtained.

Advantageous effects in the present embodiment may be obtained similarly as in the above-described first embodiment.

While the configuration of employing Ti as the material of the cover metal film 106 is illustrated in the above-described embodiment, a material containing a main constituent other than Cu may be employed, and a material that is capable of causing a diffusion of the constituents over the plated film in the thermal processing at a temperature of 100 to 400 degrees C. is more preferable.

Seventh Embodiment

While first embodiment illustrates the configuration of employing monolayer structure for the cover metal film 106 formed in the recessed section 111, seventh embodiment illustrates a multiple-layered structure for the cover metal film.

Since a method for manufacturing a semiconductor device in the present embodiment includes similar process operations except operations of forming the cover metal film 106, unlike the operations of forming the cover metal film 106 described in reference to FIG. 1C and FIG. 2A in the above-described first embodiment, only operations of forming the cover metal film 106 in the recessed section 111 will be described below, and other operations will not be presented.

FIG. 18 and FIGS. 19A and 19B are cross-sectional views, illustrating an example of a process for manufacturing a semiconductor device according to the present embodiment. In the present embodiment, the cover metal film 106 formed in the recessed section 111 includes a first region including a bottom section of the recessed section 111 and a second region including an aperture of the recessed section 111, and the portion of the cover metal film 106 in the first region (cover metal film 116a) is made of a material, which is different from a material for the portion of the cover metal film 106 in the second region (cover metal film 116b).

First of all, as shown in FIG. 18, the cover metal film 116a is formed on the insulating film 100 and the recessed section 111 by employing, for example, a sputter deposition process. Subsequently, the cover metal film 116b is stacked on the cover metal film 116a by employing a material that is different from the material for the cover metal film 116a. The cover metal film 106 includes a first region 111a including the bottom section of the recessed section 111 and a second region 111b including the aperture of the recessed section 111.

Next, as shown in FIG. 19A, the portion of the cover metal film 116b on the side surfaces of the recessed section 111 near the bottom surface side is selectively removed to expose the cover metal film 116a in the side of the bottom section of the recessed section 111. This provides the cover metal film 106, in which the cover metal film 116a is exposed in the first region 111a and the cover metal film 116b is exposed in the second region 111b. The structure of such cover metal film 106 is suitably controlled by suitably optimizing the process conditions for depositing the cover metal film 106 and the employed metallic material.

Subsequently, the cover metal film 116a and the cover metal film 116b on the bottom section of the recessed section 111 are removed to expose the seed film 104 over the bottom section of the recessed section 111 (FIG. 19B). Then, similarly as in the above-described embodiment, a plating process is conducted by employing the seed film 104 to obtain a desired semiconductor device.

In the present embodiment, the cover metal film 116b is a metal film with enhanced selectivity, and the cover metal film 116a is a metallic film with improved adhesiveness. This allows providing improved adhesiveness between the cover metal film 106 and the plated film grown by the plating deposition, and also providing improved selectivity of the Cu plating process.

While a selective plating deposition can be achieved from the bottom section of the recessed section, when the inside of the recessed section, or more specifically the bottom section, the side surfaces and the vicinity of the aperture of the recessed section is covered with the metal film having enhanced adhesiveness, a selective break is caused near the aperture of the recessed section to possibly generating a void. On the contrary, the cover metal film 106 of the present embodiment is composed of different materials in vicinity of the bottom section and in vicinity of the aperture of the recessed section 111. Since the metal film 116b with improved selectivity is formed in vicinity of the aperture in the present embodiment, a generation of a void due to the above-described selective break can be inhibited. Other advantageous effects are similar to that in the above-described first embodiment.

In addition to above, the configuration of the cover metal film 106 is not particularly limited to the configuration shown in FIGS. 18 and 19A and 19B, and various modifications are also available. For example, the first region 111a may include at least the bottom section of the recessed section 111, and the second region 111b may include at least the aperture of the recessed section 111.

In addition, the cover metal film 106 is not limited to the dual-layer structure, and may have a multiple-layered structure composed of further different materials. In such case, the regions to be removed in the cover metal film 106 may be different in the respective layers. In addition, the vicinity of the bottom surface of the side wall of the recessed section 111 may be coated in at least one layer. In this case, the advantageous effect similar as in the above-described embodiment is obtained.

It is intended that the semiconductor device according to the present invention is not limited to the above-described embodiment, and various modifications thereof may also available.

While the configuration of the cover metal film 106 that coats substantially the entire surface of the inner walls of the recessed section 111 is described in the above-described embodiment, the coating is not limited to a continuous coating, and may be with an intermittent coating, and may be with the coating over only one section of the inner wall in the recessed section. However, in such case, the aspect ratio of the recessed section may be preferably equal to or lower than 1. This allows reducing the process time for the plating deposition process while achieving an effect for reducing the generation of voids. On the contrary, when the cover metal film 106 provides the coating over the substantially entire surface of the inner wall of the recessed section, higher effect for reducing the generation of voids can be obtained, although the process time for the plating deposition is relatively increased.

While the above-described embodiments illustrate the configuration as shown in FIG. 2A, in which the portion of the cover metal film 106 on the bottom section of the recessed section 111 is removed to expose the seed film 104 and the portions of the cover metal film 106 on the side surfaces of the recessed section 111 is not removed, the configuration is not limited thereto. For example, as shown in FIG. 20, the portions of the cover metal film 106 formed on the side surface of the recessed section 111 in the side near the bottom section may be removed, in addition to that formed in the bottom section of the recessed section 111, to expose the seed film 104. More specifically, the profile of the cover metal film 106 within the recessed section 111 may be that the side near the bottom section of the recessed section 111 is thinner and the side near the aperture is thicker.

While the above-described embodiments illustrate the configuration, in which Ti is employed for the material of the cover metal film 106, a material containing a main constituent other than Cu may be employed, and a material that is capable of causing a diffusion of the constituents over the plated film in the thermal processing at a temperature of 100 to 400 degrees C. may be more preferable.

The material for the cover metal film 106 may be a material containing, for example, at least one selected from the group consisting of Cu, Ta, Al, Sn, Mn, Ru and Ir.

While the above-described embodiments illustrate the configuration, in which the atmospheres for the first thermal processing and the second thermal processing contain oxygen and water, when the cover metal film 106 contains at least one of Ta, Cu, Ti, Al, Sn or Mn, the operation for first thermal processing may be conducted within an atmosphere containing at least one of nitrogen, oxygen, water or ammonia. This allows the metal component contained in the cover metal film 106 causing a diffusion into the plated film.

It is apparent that the present invention is not limited to the above embodiment, and may be modified and changed without departing from the scope and spirit of the invention.

What is claimed is:

1. A method for manufacturing a semiconductor device, including:
    preparing a substrate having a recessed section and a seed film, said seed film being exposed to a bottom section of said recessed section;
    forming an electroconductive film in said recessed section, said electroconductive film containing a metallic element having a higher resistance as compared with the seed film;
    selectively removing said electroconductive film to expose said seed film over the bottom section of said recessed section; and
    conducting a growth of a plated film to fill said recessed section by utilizing a portion of said seed film exposed over the bottom section of said recessed section as a seed.

2. The method for manufacturing a semiconductor device as set forth in claim 1, wherein said preparing the substrate includes:
    forming said recessed section in said substrate; and
    forming said seed film in said recessed section.

3. The method for manufacturing a semiconductor device as set forth in claim 1, wherein said preparing the substrate includes:
    forming a first insulating layer over said substrate;
    burying the seed film in said first insulating layer;
    forming a second insulating layer over said first insulating layer; and
    selectively removing said second insulating layer to form said recessed section, exposing said seed film over the bottom section of said recessed section.

4. The method for manufacturing a semiconductor device as set forth in claim 1, wherein said preparing the substrate includes:
    forming said recessed section in said substrate;
    forming an insulating film in said recessed section; and
    forming said seed film over said insulating film in said recessed section.

5. The method for manufacturing a semiconductor device as set forth in claim 1, wherein said seed film contains copper (Cu).

6. The method for manufacturing a semiconductor device as set forth in claim 1, wherein said electroconductive film contains at least one element selected from a group consisting of tantalum (Ta), titanium (Ti), aluminum (Al), tin (Sn), manganese (Mn), ruthenium (Ru) and iridium (Ir).

7. The method for manufacturing a semiconductor device as set forth in claim 1, further comprising, after said conducting the growth of the plated film:
    carrying out a first thermal processing for diffusing a metallic element contained in said electroconductive film in said plated film.

8. The method for manufacturing a semiconductor device as set forth in claim 1, further comprising, after said conducting the growth of the plated film:
    carrying out a chemical mechanical polishing process for said plated film to leave said plated film only in said recessed section; and
    carrying out a second thermal processing for causing a segregation of the metallic element contained in said electroconductive film in vicinity of the surface of said plated film.

9. The method for manufacturing a semiconductor device as set forth in claim 1, wherein said selectively removing the electroconductive film includes removing said electroconductive film by utilizing radio frequency (RF) bias.

10. The method for manufacturing a semiconductor device as set forth in claim 1, wherein, in said conducting the growth of the plated film, said plated film forms a protruded section over an aperture of said recessed section, said protruded section having a height of equal to or higher than 1 nm and equal to or lower than 100 nm.

11. The method for manufacturing a semiconductor device as set forth in claim 1, wherein, in said forming the electroconductive film in said recessed section, said electroconductive film formed in said recessed section has a first region including the bottom section of said recessed section and a second region including the aperture of the said recessed section, and wherein a material for forming said electroconductive film in said first region is different from a material for forming said electroconductive film in said second region.

12. The method for manufacturing a semiconductor device as set forth in claim 1, wherein said recessed section serves as a via hole and an interconnect trench of a dual damascene structure formed by a dual damascene process, and wherein said selectively removing the electro conductive film includes exposing said seed film in the bottom section of said via hole and/or said interconnect trench.

* * * * *